United States Patent
Taguchi et al.

(10) Patent No.: US 7,888,953 B2
(45) Date of Patent: Feb. 15, 2011

(54) PROBE CARD

(75) Inventors: Yuichi Taguchi, Nagano (JP); Akinori Shiraishi, Nagano (JP); Masahiro Sunohara, Nagano (JP); Kei Murayama, Nagano (JP); Hideaki Sakaguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/464,916

(22) Filed: May 13, 2009

(65) Prior Publication Data

US 2009/0284276 A1 Nov. 19, 2009

(30) Foreign Application Priority Data

May 19, 2008 (JP) .............................. 2008-130389

(51) Int. Cl.
*G01R 31/02* (2006.01)
(52) U.S. Cl. ................................. 324/750.16
(58) Field of Classification Search ......... 324/754–762, 324/750.15, 750.16, 750.24, 756.02, 762.01, 324/762.05

See application file for complete search history.

(56) References Cited

U.S. PATENT DOCUMENTS

| | | | | |
|---|---|---|---|---|
| 5,850,148 | A * | 12/1998 | Nam ........................... | 324/761 |
| 7,219,418 | B2 * | 5/2007 | Byrd ........................... | 29/623 |
| 7,368,927 | B2 * | 5/2008 | Smith et al. ............. | 324/754.07 |
| 7,429,497 | B2 * | 9/2008 | Stone ......................... | 438/106 |
| 7,432,728 | B2 * | 10/2008 | Kilicaslan et al. ........... | 324/754 |
| 7,498,827 | B2 * | 3/2009 | Mochizuki et al. .......... | 324/754 |
| 7,595,651 | B2 * | 9/2009 | Ku et al. ..................... | 324/754 |
| 7,750,651 | B2 * | 7/2010 | Chao et al. ............. | 324/756.03 |
| 2006/0261828 | A1 * | 11/2006 | Cram et al. ................. | 324/754 |

FOREIGN PATENT DOCUMENTS

JP 2006-049498 2/2006

* cited by examiner

*Primary Examiner*—Ha Tran T Nguyen
*Assistant Examiner*—Joshua Benitez
(74) *Attorney, Agent, or Firm*—IPUSA, PLLC

(57) ABSTRACT

A probe card is disclosed that includes a board having a first surface and a second surface facing away from each other and a through hole formed between the first and second surfaces; and a probe needle having a penetration part and a support part. The penetration part is placed in the through hole without contacting the board and projects from the first and second surfaces of the board. The support part is integrated with a first one of the end portions of the penetration part and connected to one of the first and second surfaces of the board. The support part has a spring characteristic. The penetration part is configured to have a second one of its end portions come into contact with an electrode pad of a semiconductor chip at the time of conducting an electrical test on the semiconductor chip.

6 Claims, 28 Drawing Sheets

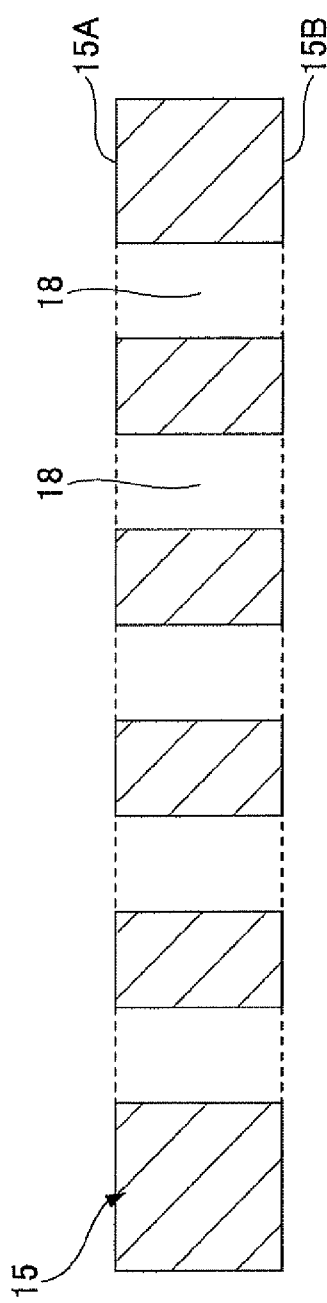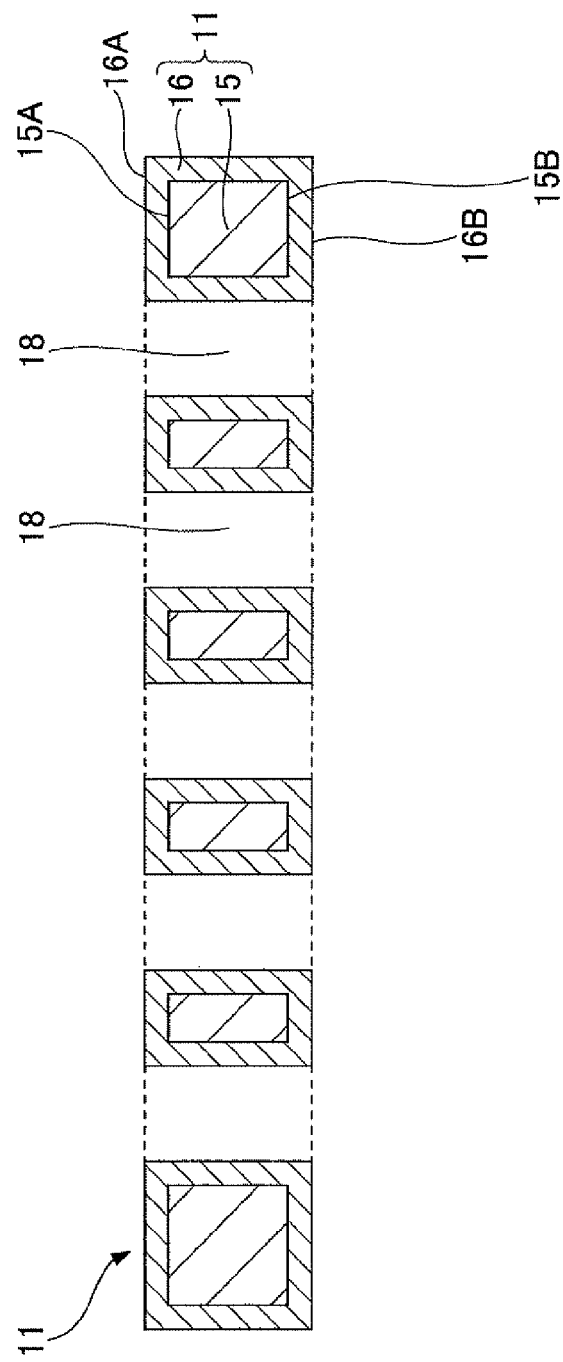
FIG.7A
FIG.7B

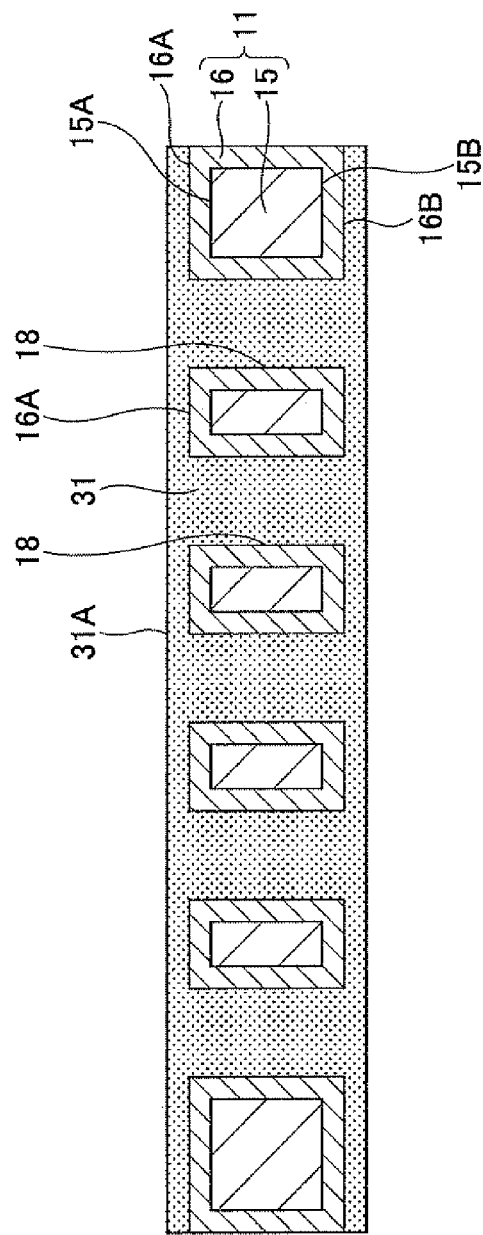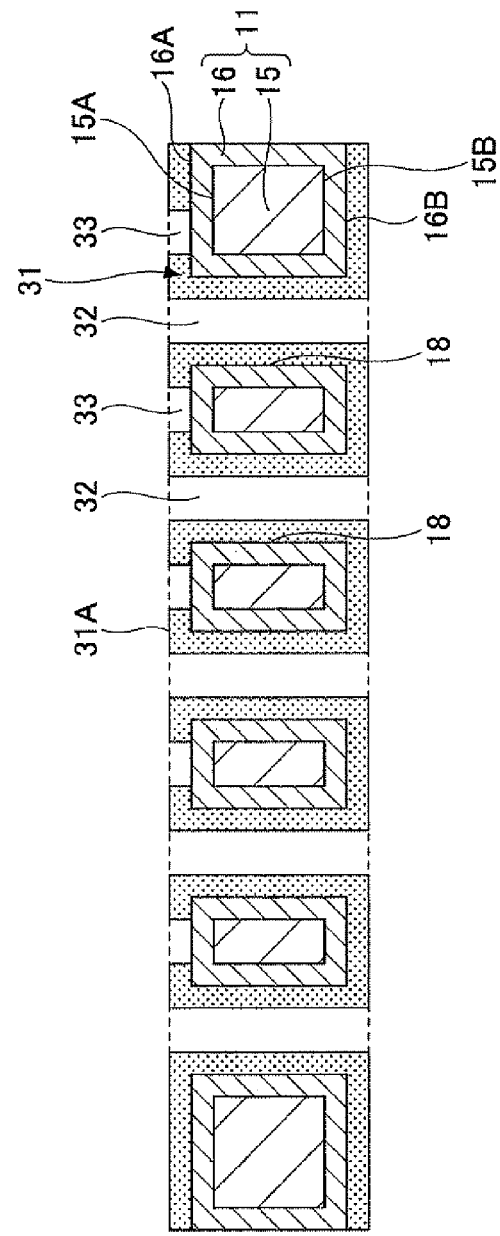

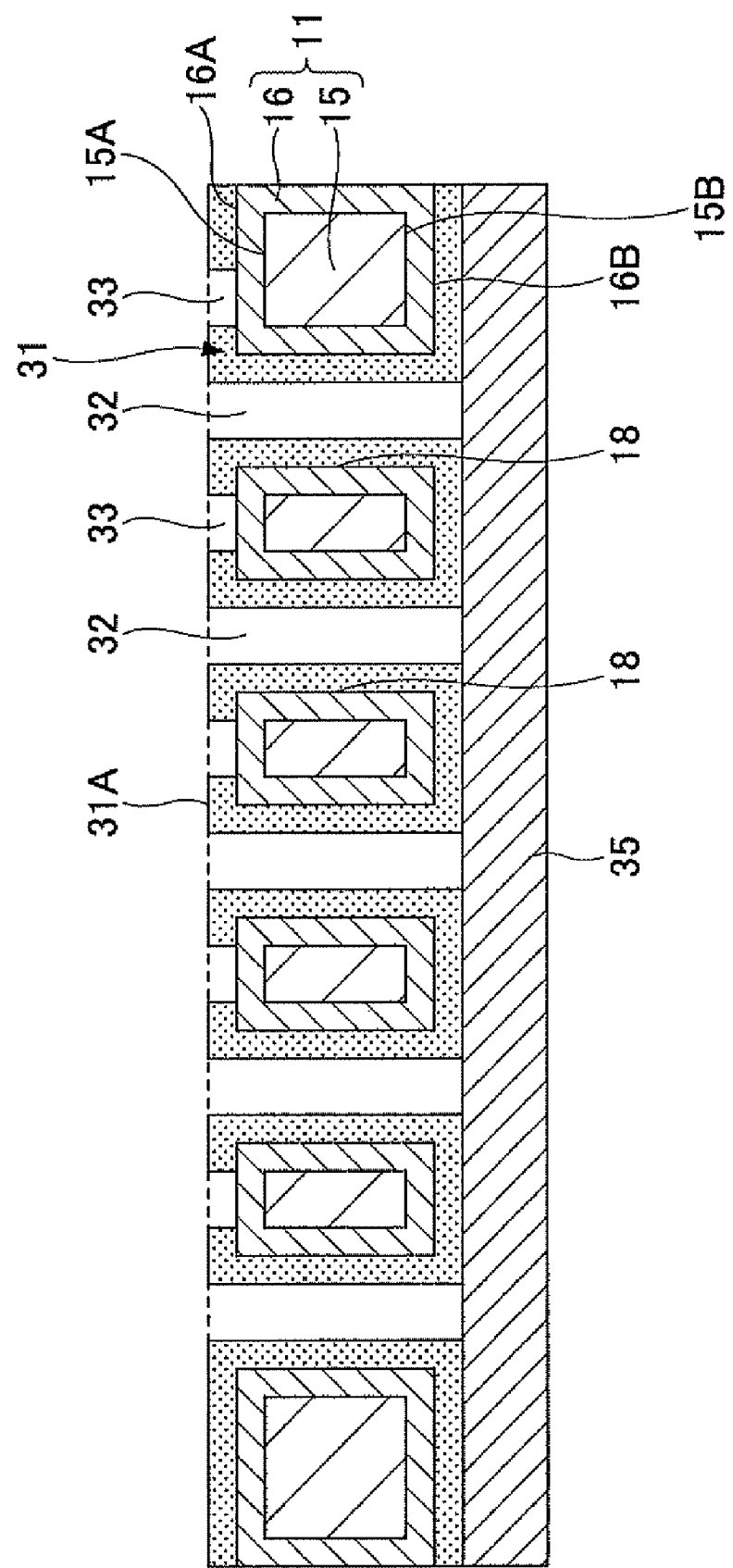

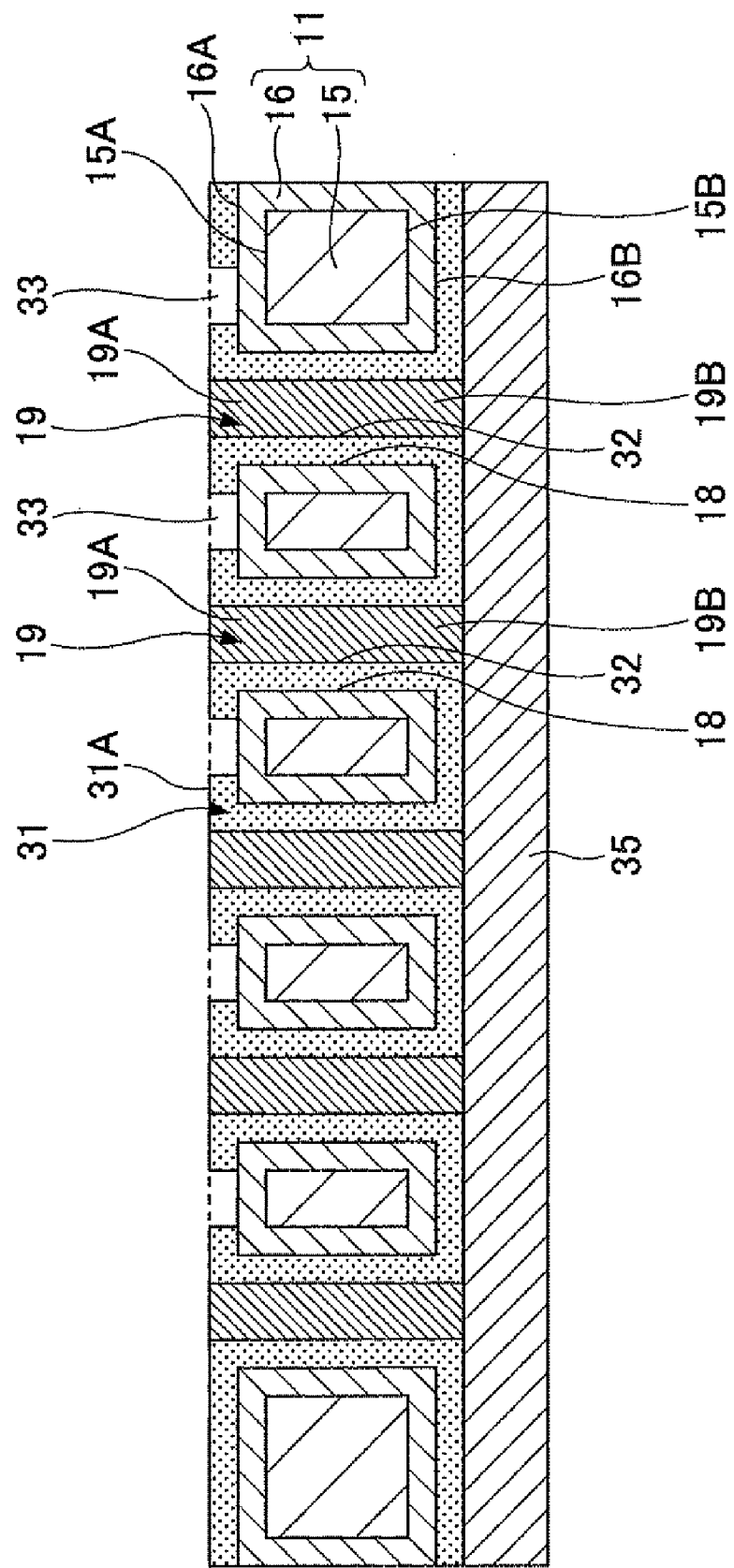

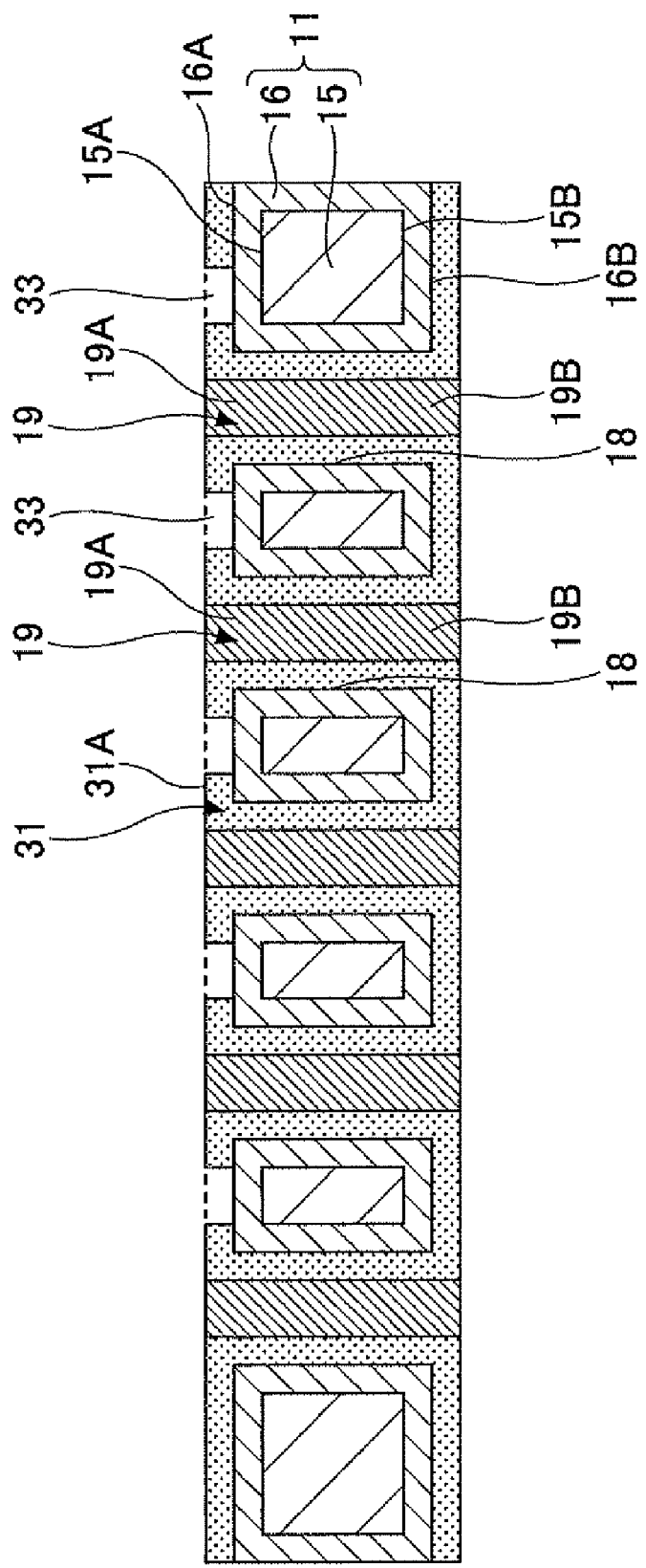

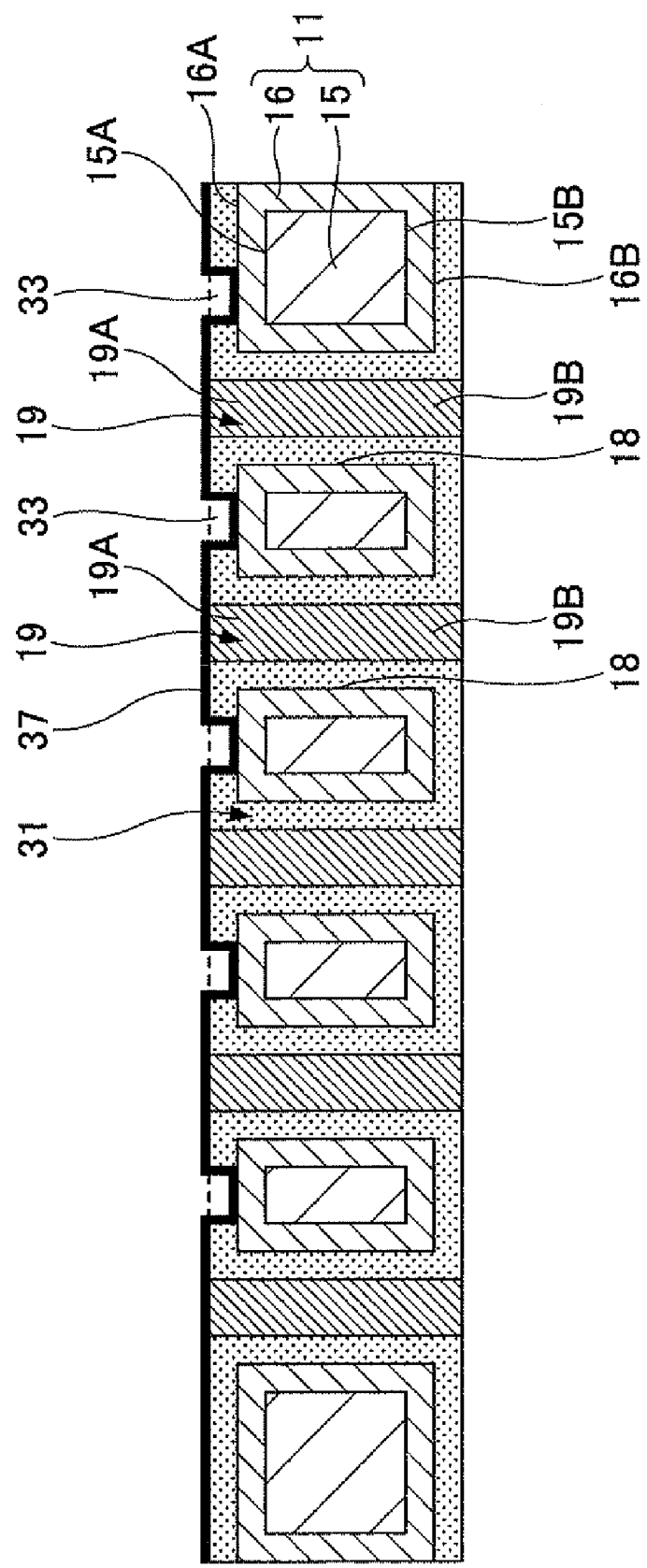

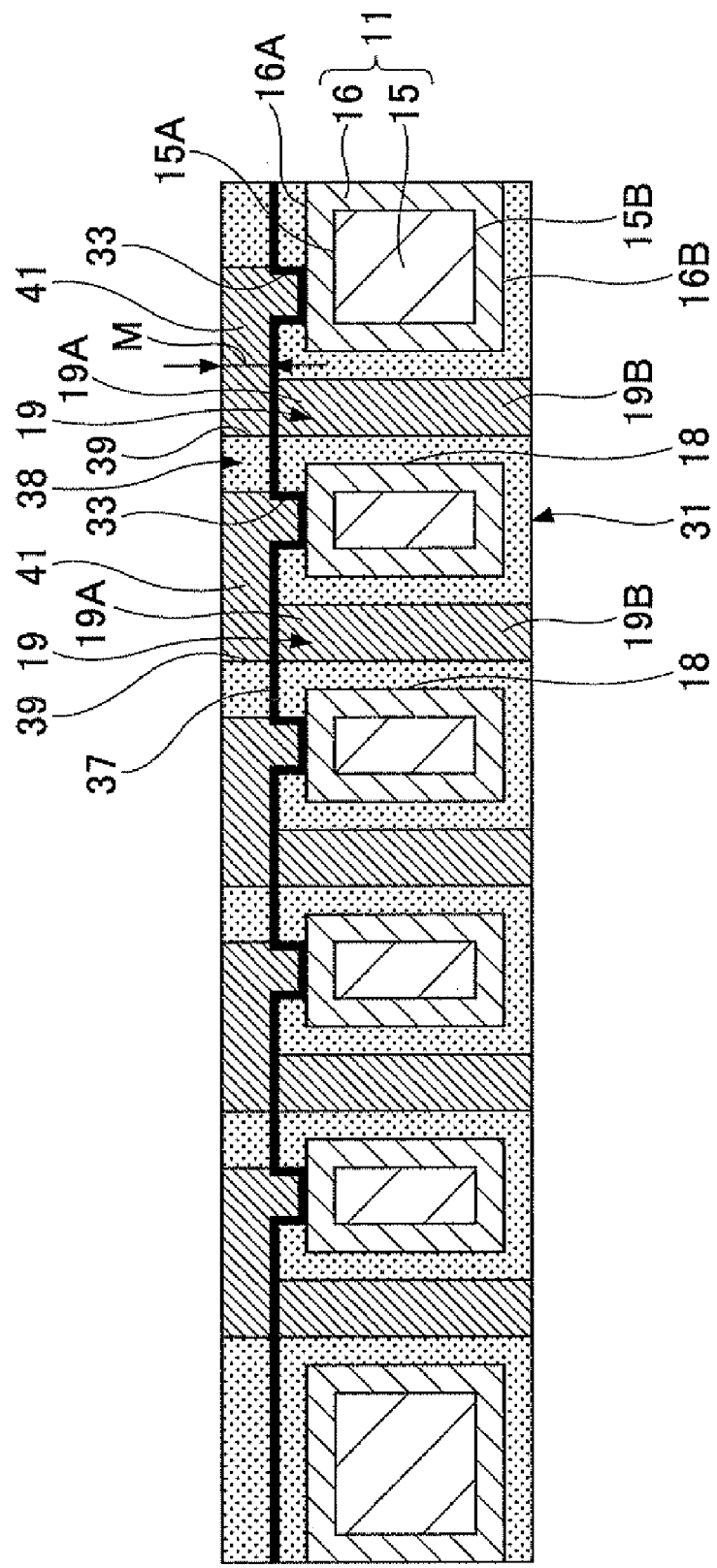

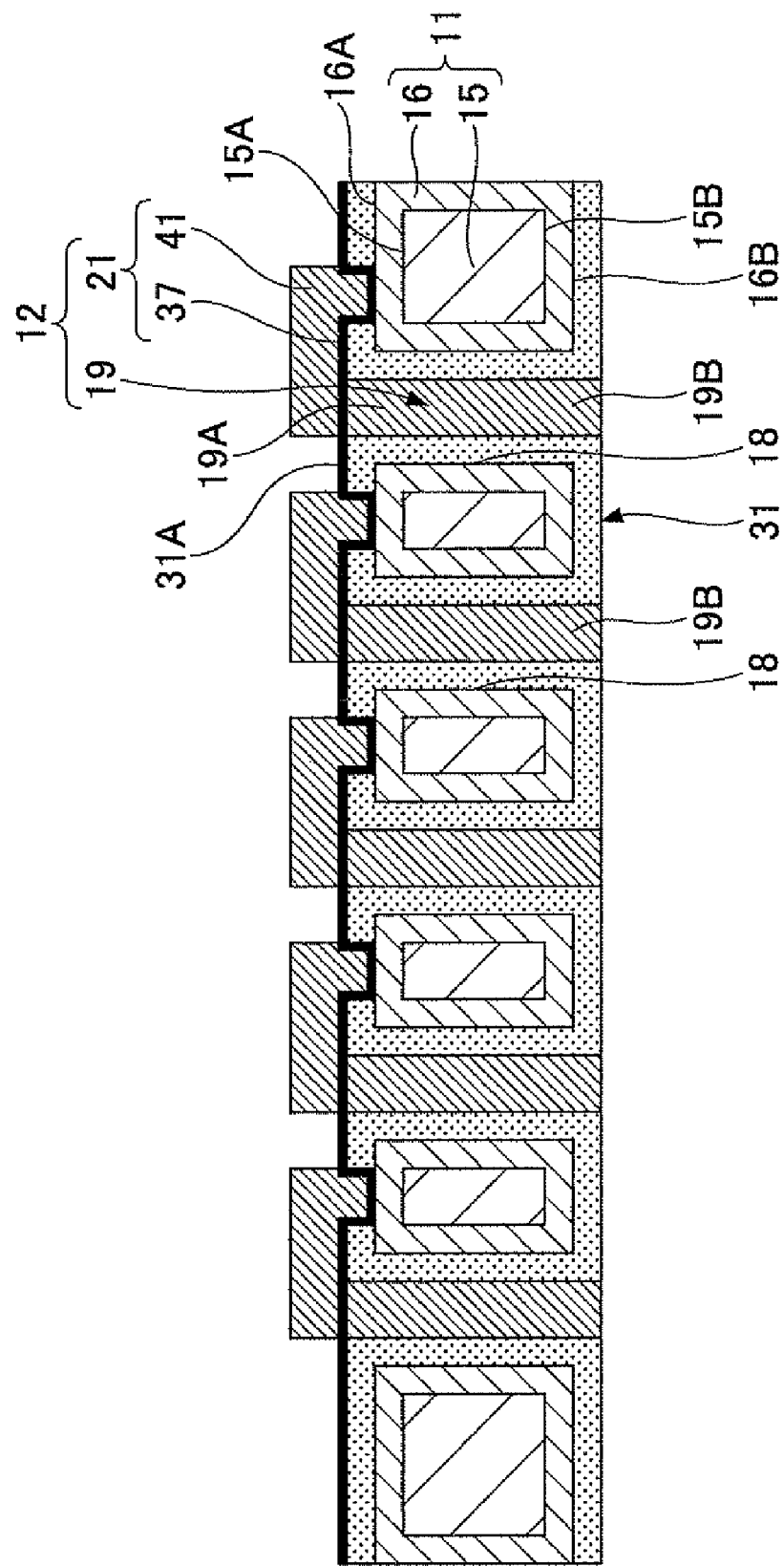

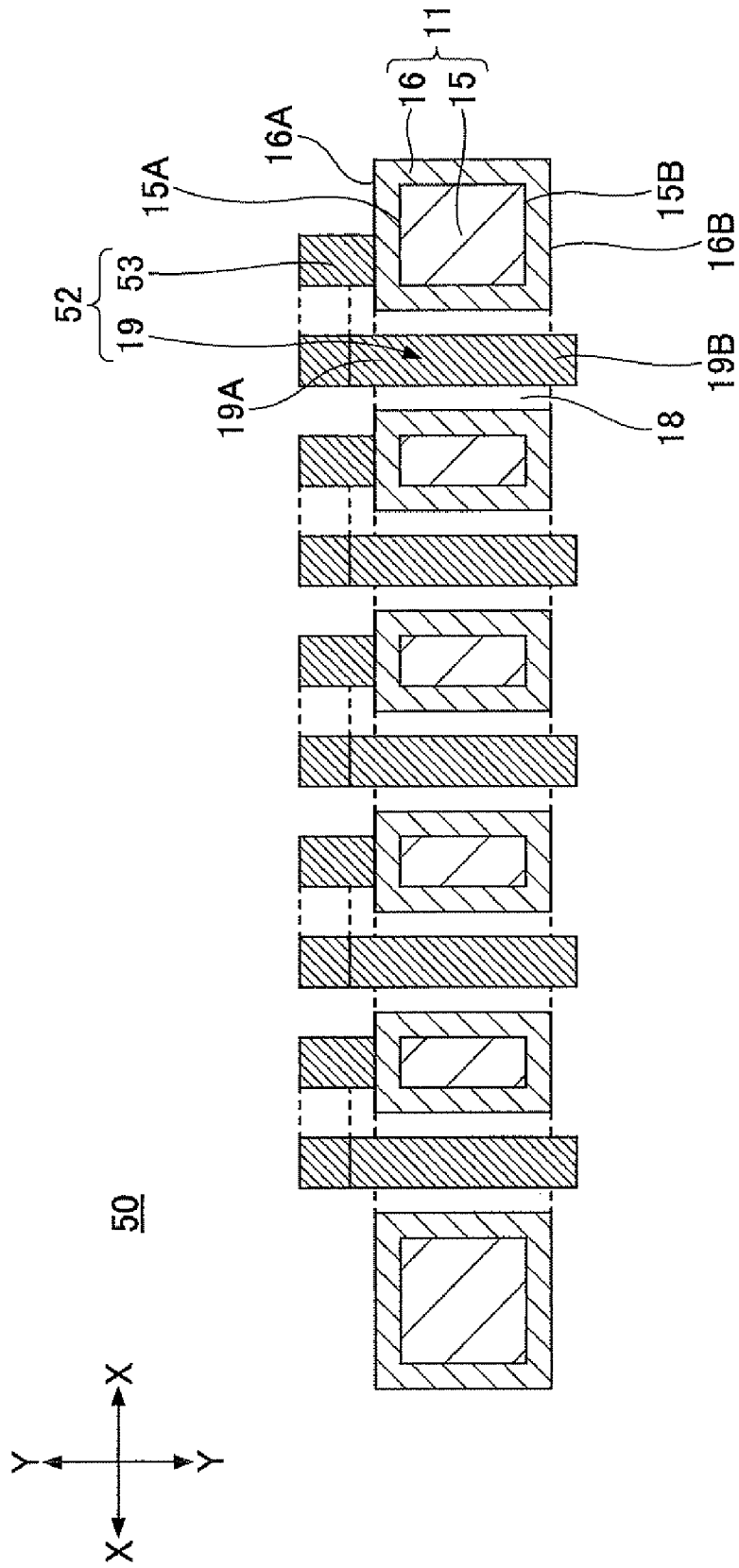

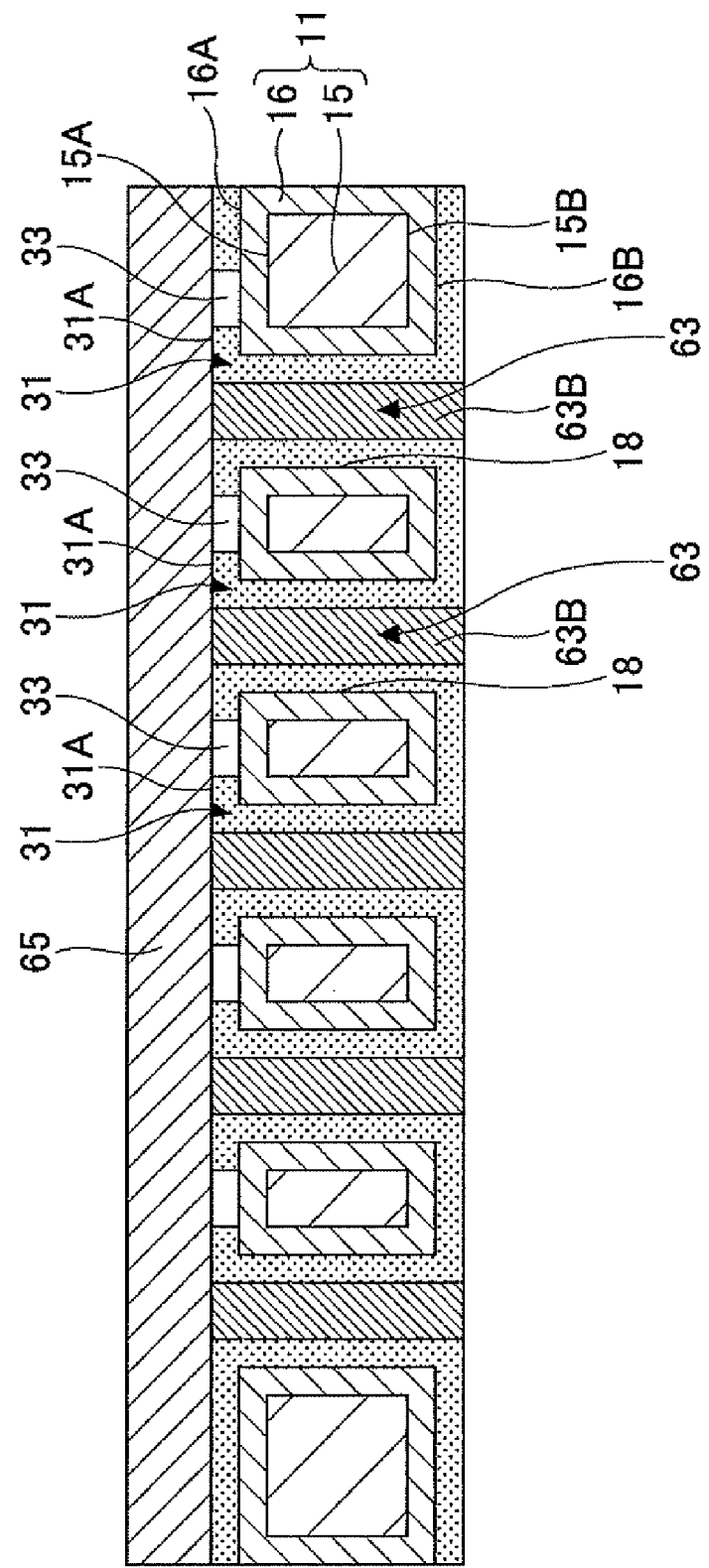

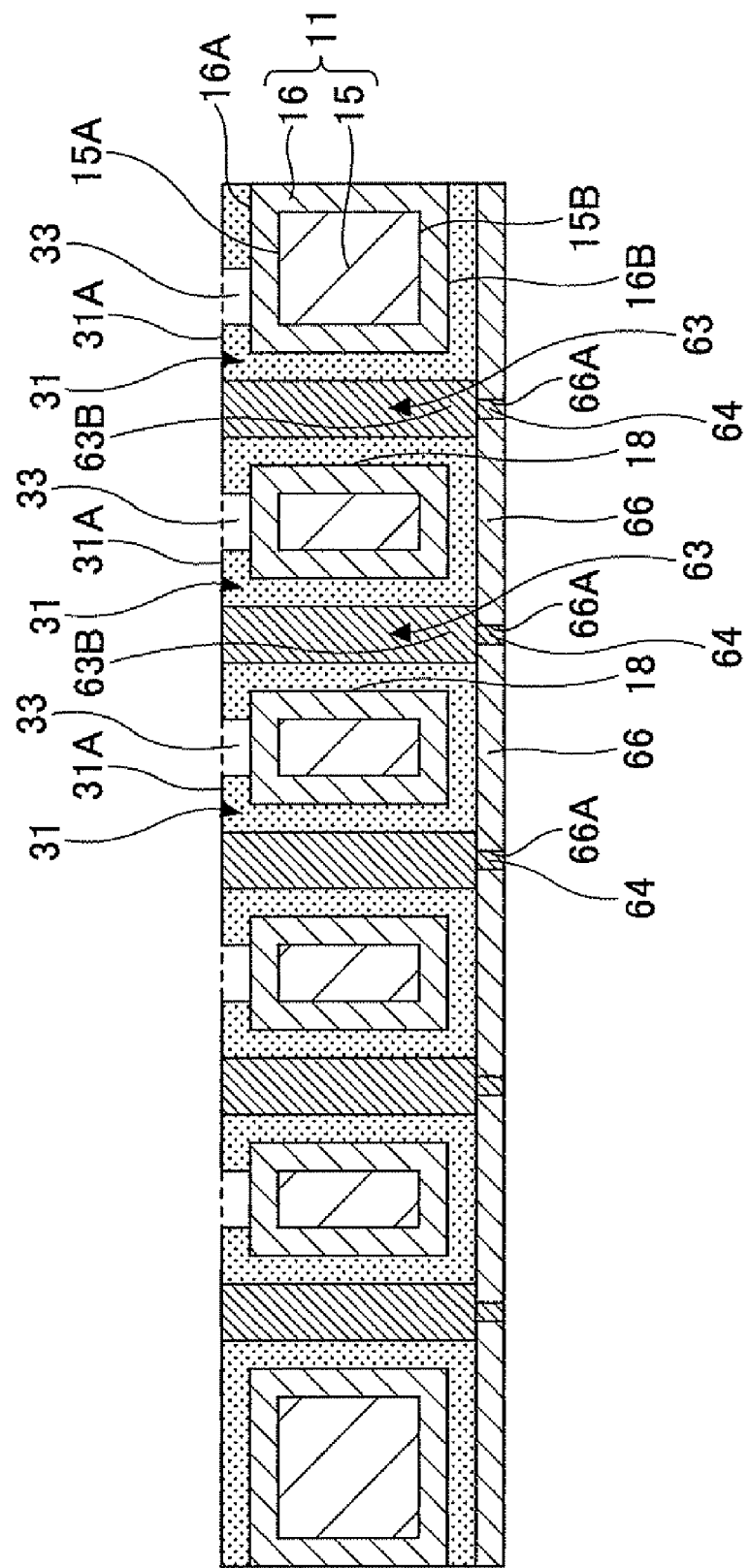

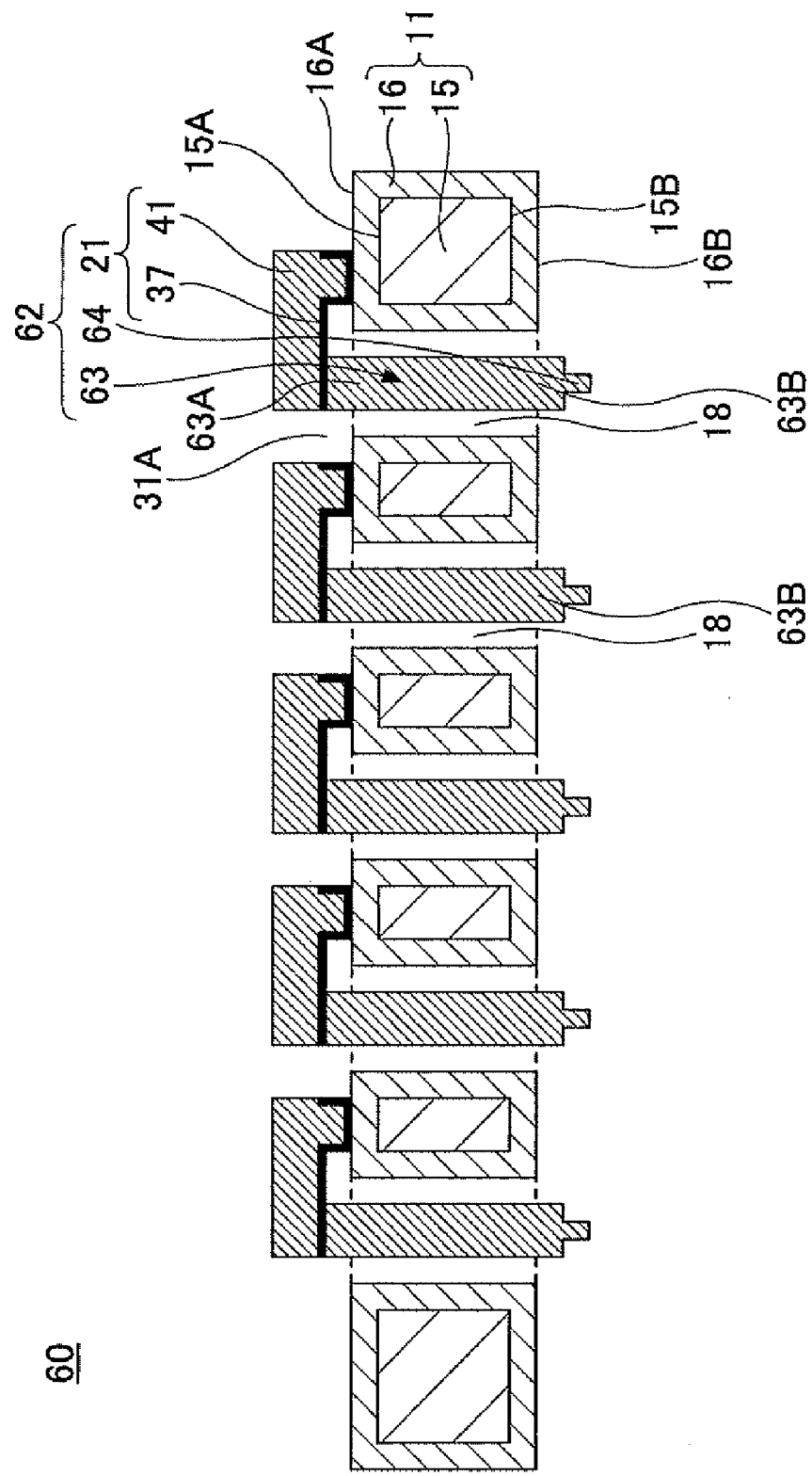

PROBE CARD

BACKGROUND OF THE INVENTION

1. Field of the Invention

The embodiments discussed herein relate to a probe card having probe needles to come into contact with corresponding electrode pads of a semiconductor chip at the time of conducting an electrical test on the semiconductor chip.

2. Description of the Related Art

Conventionally, probers are used to conduct an electrical test on semiconductor chips. The prober includes a probe card having probe needles to come into contact with corresponding electrode pads provided on a semiconductor chip.

FIG. 1 is a cross-sectional view of a conventional probe card.

Referring to FIG. 1, a conventional probe card 200 includes a probe card body 201 and multiple probe needles 203.

The probe card body 201, which is a wiring board, is electrically connected to the probe needles 203. The probe needles 203 are provided on a lower surface 201A of the probe card body 201. The probe needles 203 have a spring characteristic and have a cantilever shape. At the time of conducting an electrical test on a semiconductor chip 205 using a prober (not graphically illustrated), tips 203A of the probe needles 203 come into contact with corresponding electrode pads 206 provided on the semiconductor chip 205.

FIG. 2 and FIG. 3 are plan views of semiconductor chips to be tested with a prober.

Examples of the semiconductor chip 205 to be tested with a prober include a semiconductor chip 205-1 with the electrodes 206 in a peripheral arrangement as illustrated in FIG. 2 and a semiconductor chip 205-2 with the electrodes 206 in a matrix arrangement as illustrated in FIG. 3. (See, for example, Japanese Laid-Open Patent Application No. 2006-49498.)

However, the conventional probe needles 203 are provided with a wide pitch J (greater than or equal to 150 μm) (FIG. 1). Therefore, there is a problem in that if the electrode pads 206 provided on the semiconductor chip 205-1 are arranged with a narrow pitch, the tips 203A of the probe needles 203 cannot be brought into contact with the corresponding electrode pads 206 provided on the semiconductor chip 205-1 with accuracy.

On the other hand, according to the semiconductor chip 205-2, the electrode pads 206 are arranged in a matrix so that their pitch is narrow. Therefore, there is a problem in that the tips 203A of the probe needles 203 cannot be brought into contact with the corresponding electrode pads 206 provided on the semiconductor chip 205-2 with accuracy. This problem is conspicuous particularly in the case of reducing the pitch for the electrode pads 206 arranged in a matrix on the semiconductor chip 205-2.

SUMMARY OF THE INVENTION

According to an aspect of the present invention, a probe card is provided that can bring probe needles into contact with corresponding electrode pads provided on a semiconductor chip with accuracy even if the electrode pads are arranged with a narrow pitch or in a matrix.

According to one embodiment of the present invention, a probe card is provided that includes a board having a first surface and a second surface facing away from each other and a through hole formed between the first and second surfaces; and a probe needle having a penetration part and a support part, the penetration part being placed in the through hole without contacting the board and projecting from the first and second surfaces of the board, the support part being integrated with a first one of end portions of the penetration part and connected to one of the first and second surfaces of the board, and having a spring characteristic, wherein the penetration part is configured to have a second one of the end portions thereof come into contact with an electrode pad of a semiconductor chip at a time of conducting an electrical test on the semiconductor chip.

BRIEF DESCRIPTION OF THE DRAWINGS

Other objects, features and advantages of the present invention will become more apparent from the following detailed description when read in conjunction with the accompanying drawings, in which:

FIGS. 7A through 7M are diagrams illustrating a process for manufacturing a probe card according to the first embodiment of the present invention;

FIG. 8 is a cross-sectional view of a probe card according to a second embodiment of the present invention;

FIGS. 14A through 14G are diagrams illustrating a process for manufacturing a probe card according to the third embodiment of the present invention.

DETAILED DESCRIPTION OF THE PREFERRED EMBODIMENTS

Next, a description is given, with reference to the accompanying drawings, of embodiments of the present invention.

First Embodiment

Figure 1:
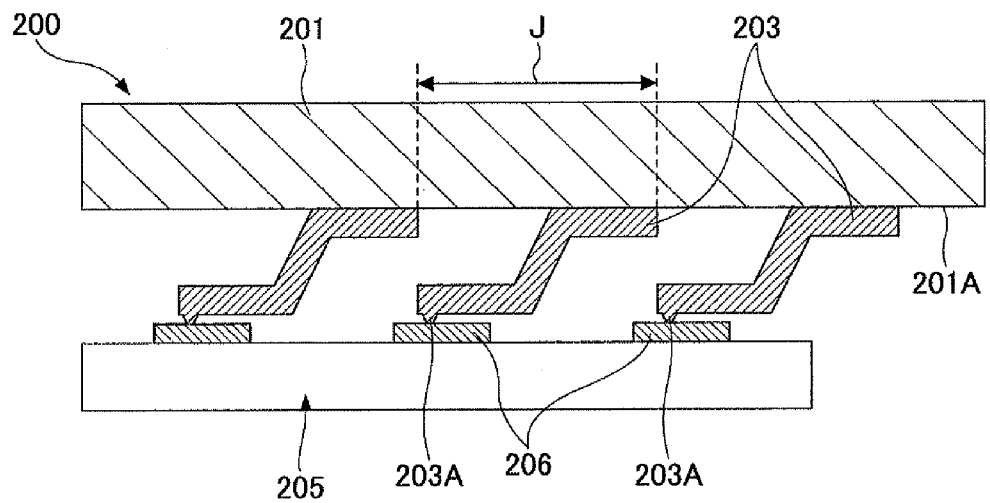
FIG. 1 is a cross-sectional view of a conventional probe card.
Figure 2:
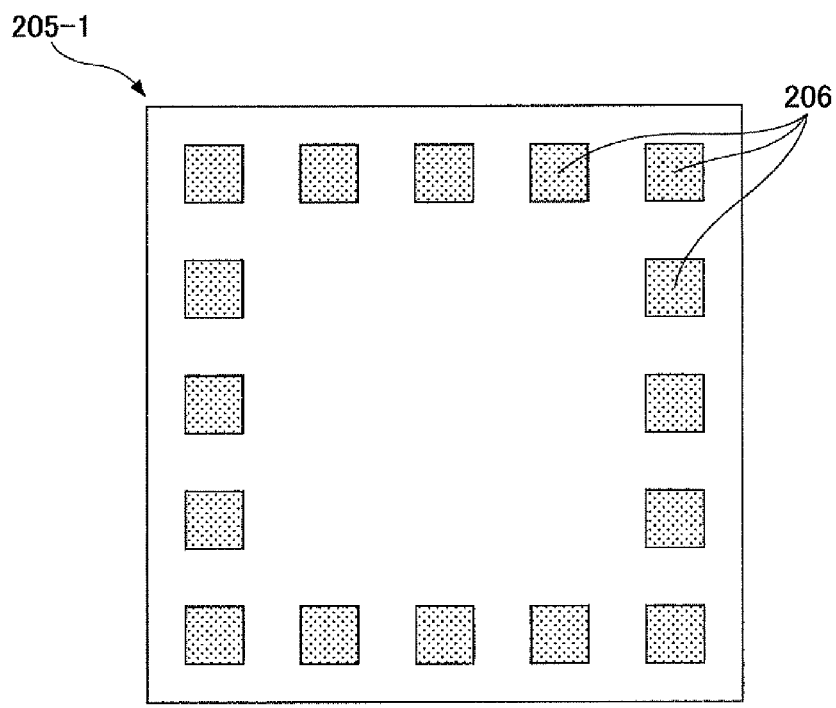
FIG. 2 is a plan view of a semiconductor chip to be tested with a prober.
Figure 3:
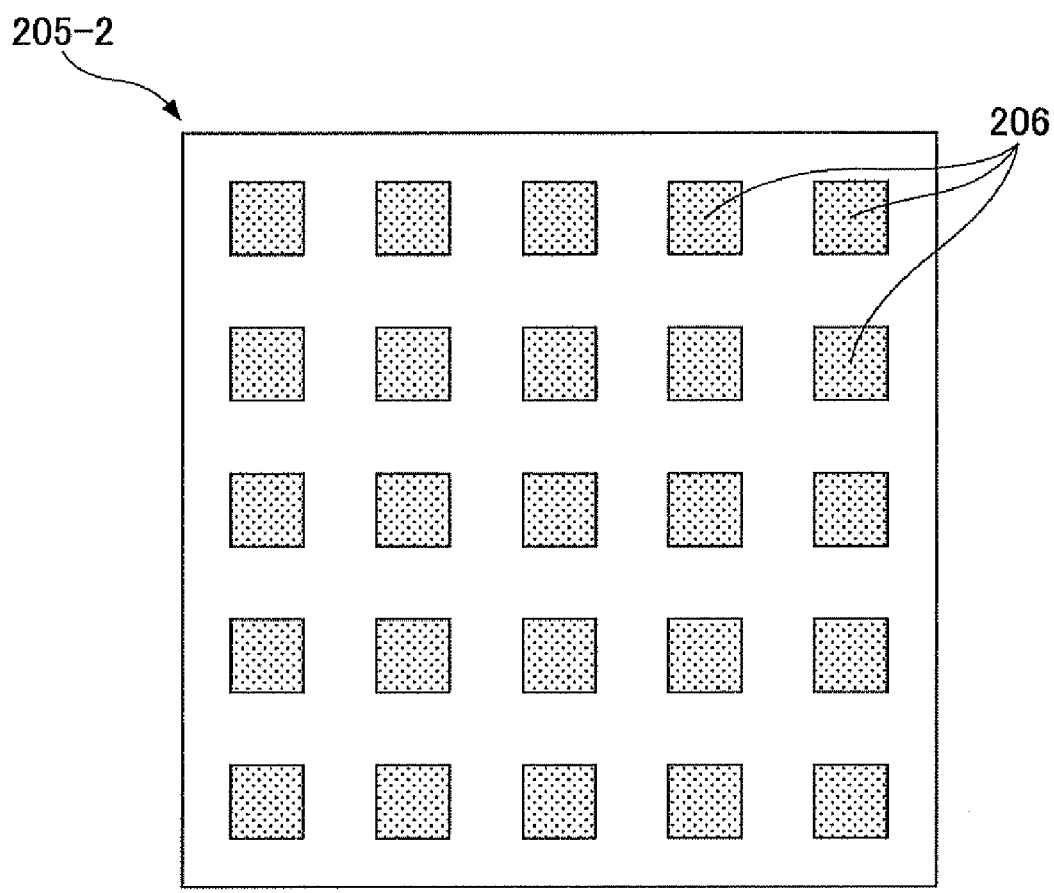
FIG. 3 is a plan view of another semiconductor chip to be tested with a prober.
Figure 4:
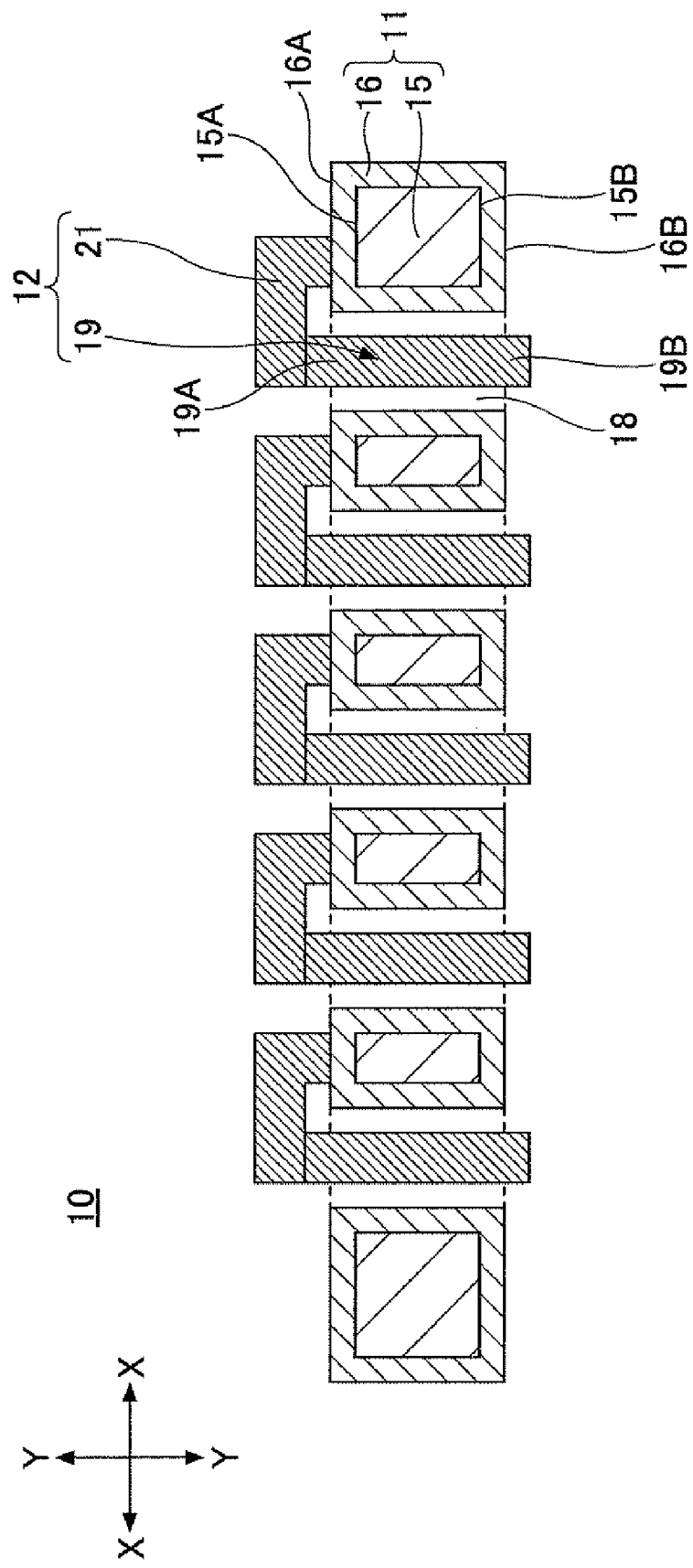
FIG. 4 is a cross-sectional view of a probe card according to a first embodiment of the present invention.
Figure 5:
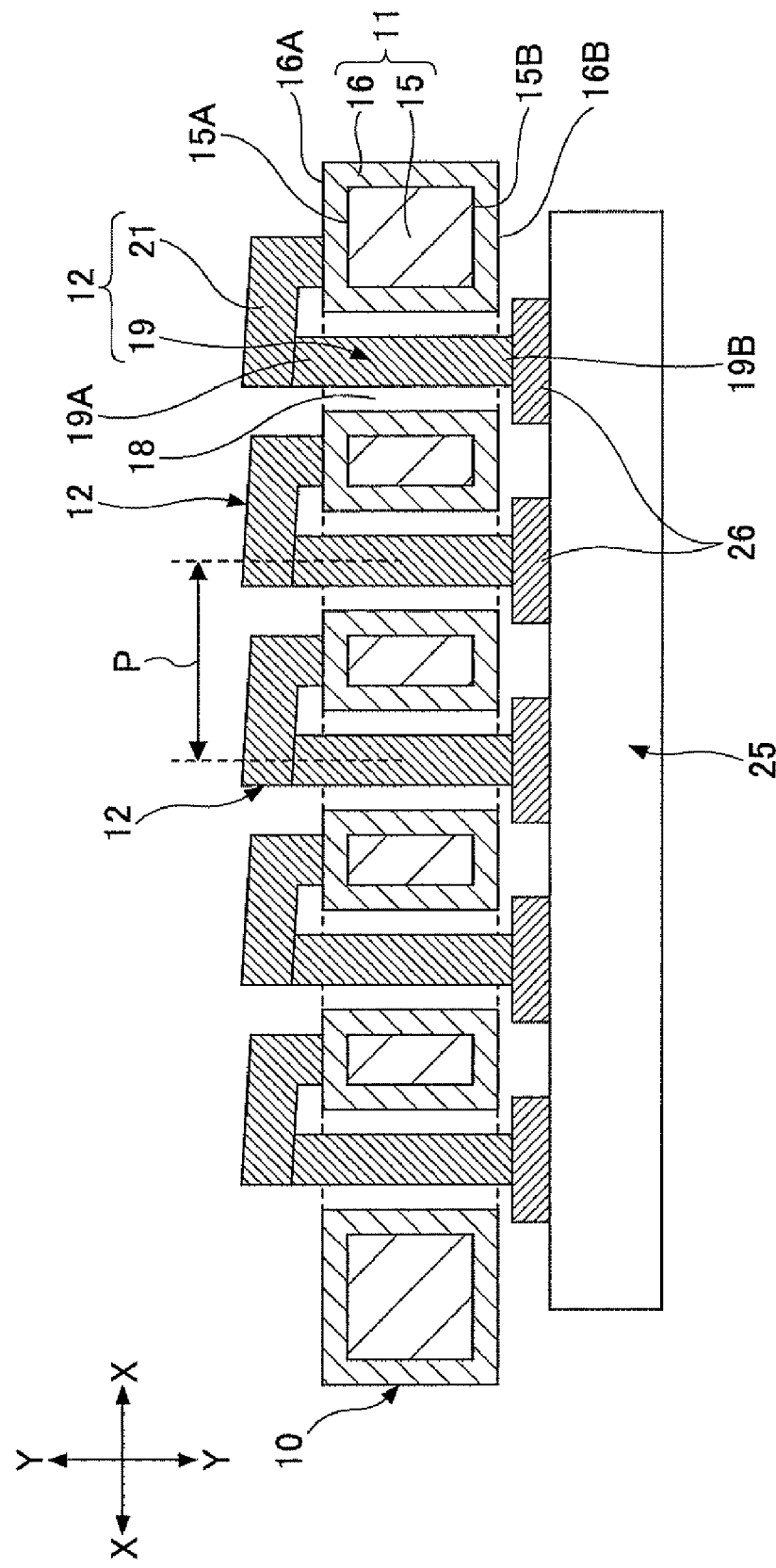
FIG. 5 is a schematic diagram showing probe needles illustrated in FIG. 4 and corresponding electrode pads of a semiconductor chip in contact with each other according to the first embodiment of the present invention.
Figure 6:
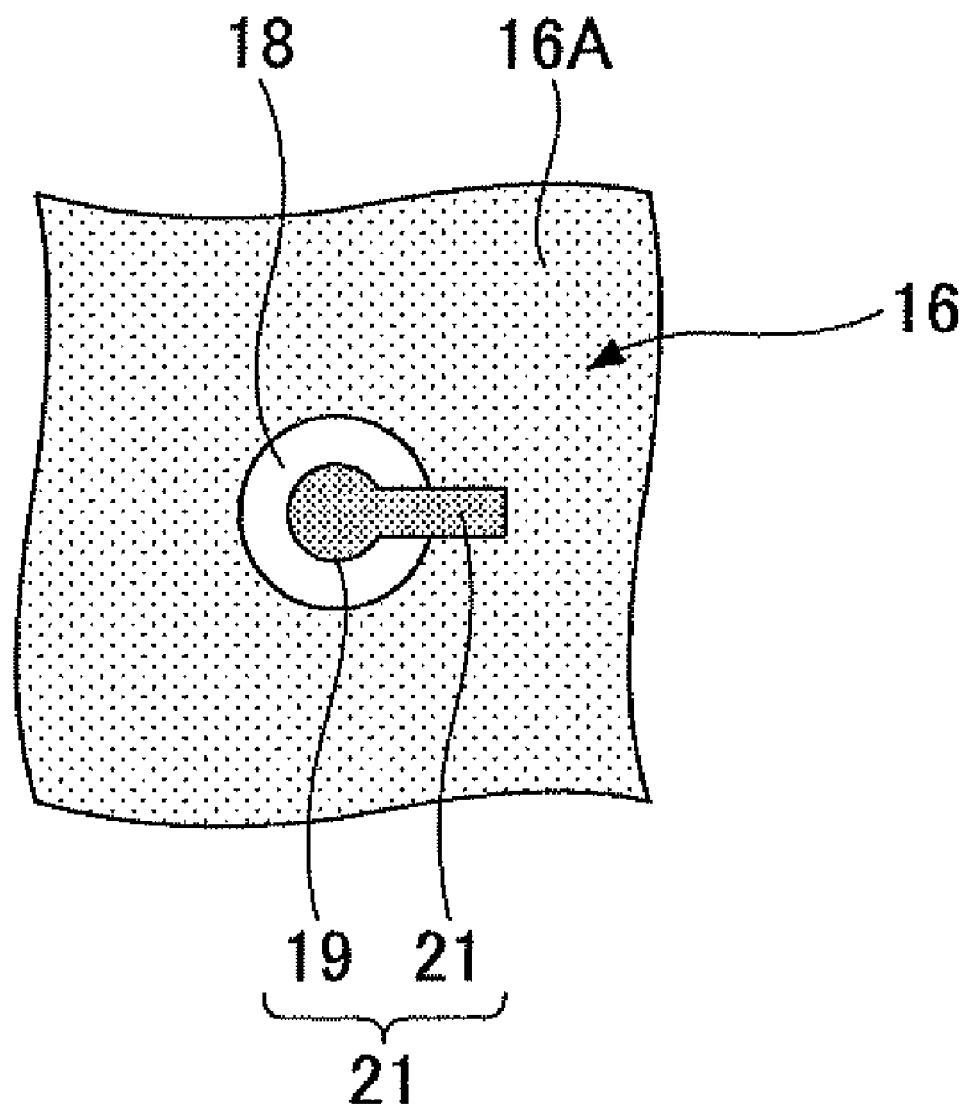
FIG. 6 is a plan view of one of the probe needles illustrated in FIG. 4 according to the first embodiment of the present invention.

FIG. 4 is a cross-sectional view of a probe card according to a first embodiment of the present invention. FIG. 5 is a schematic diagram showing probe needles illustrated in FIG. 4 and corresponding electrode pads of a semiconductor chip in contact with each other. FIG. 6 is a plan view of one of the probe needles illustrated in FIG. 4. In FIG. 5 and FIG. 6, the same elements as those described in FIG. 4 are referred to by the same reference numerals.

Referring to FIG. 4 and FIG. 5, a probe card 10 of the first embodiment includes a board 11 and multiple probe needles 12. The board 11 includes a board body (substrate) 15 and an insulating film 16. The board body 15, which has a plate shape, has multiple through holes 18 for receiving penetration parts 19 of the corresponding probe needles 12 in such a manner as to allow the penetration parts 19 to move in the Y-Y directions. The through holes 18 may be, for example, 50 μm in diameter. The pitch of the through holes 18 may be, for example, 100 μm. In FIG. 4 and FIG. 5, X-X indicates plane directions parallel to an upper surface 15A of the board body 15 and Y-Y indicates directions perpendicular to the X-X directions.

Examples of the material of the board body 15 include silicon, resin (such as insulating resin), and metal (such as copper [Cu]). In the case of using insulating resin as the material of the board body 15, the insulating film 16 illustrated in FIG. 4 and FIG. 5 may be omitted.

Further, if the semiconductor substrate (not graphically illustrated) provided in a semiconductor chip 25 is a silicon substrate, it is preferable to use silicon as the material of the board body 15.

Using silicon as the material of the board body 15 reduces the difference in coefficient of thermal expansion between the probe card 10 and the semiconductor chip 25. As a result, it is possible to bring the probe needles 12 into contact with corresponding electrode pads 26 provided on the semiconductor chip 25 with accuracy. In the case of using silicon as the material of the board body 15, the board body 15 can be, for example, 300 μm in thickness.

The insulating film 16 is provided so as to cover the surface of the board body 15 (including a portion corresponding to the side surfaces of the through holes 18). The insulating film 16 is provided for insulation between the board body 15 and the probe needles 12. Examples of the insulating film 16 include oxide films (such as a thermal oxide film). In the case of using a thermal oxide film as the insulating film 16, the insulating film 16 can be, for example, 0.5 μm to 1.0 μm in thickness.

Each probe needle 12 has the penetration part 19 and a support part 21. The penetration part 19, which is formed of a conductive material, is placed in the corresponding through hole 18 in such a manner as to be out of contact with the board body 15 and the insulating film 16. An end portion 19A (a first one of the end portions) of the penetration part 19 projects from a first surface of the board 11, that is, a surface 16A of the insulating film 16 provided on an upper surface 15A of the board body 15. The end portion 19A of the penetration part 19 is integrated with the support part 21 to form a unitary structure. An end portion 19B (a second one of the end portions) of the penetration part 19 projects from a second surface of the board 11, that is, a surface 16B of the insulating film 16 provided on a lower surface 15B of the board body 15. The end portion 19B of the penetration part 19 comes into contact with the corresponding pad 26 of the semiconductor chip 25 at the time of conducting an electrical test on the semiconductor chip 25 with a prober (not graphically illustrated). The penetration part 19 can be, for example, 30 μm in diameter.

The support part 21 has one of its end portions integrated with the end portion 19A of the penetration part 19 and has the other one of its end portions connected to the surface 16A of the insulating film 16. The support part 21 is formed of a conductive material and has a spring characteristic. The support part 21 is a member for supporting the penetration part 19 in such a manner as to allow the penetration part 19 to be movable in the Y-Y directions. As illustrated in FIG. 5, when the end portion 19B of the penetration part 19 comes into contact with the corresponding electrode pad 26, the support part 21 allows the penetration part 19 to move upward while having the end portion 19B of the penetration part 19 and the corresponding electrode pad 26 in contact with a certain force. The portion of the support part 21 in contact with the surface 16A of the insulating film 16 can be, for example, 30 μm in diameter. The support part 21 has an L-letter cross-sectional shape (FIG. 4) and a rectangular planar shape (FIG. 6).

A pitch P at which the probe needles 12 are provided (arranged) can be narrowed (reduced) by thus providing the probe card 10 with the probe needles 12 each having the penetration part 19 and the support part 21. The penetration parts 19 are placed in the corresponding through holes 18 without contacting the board body 15 and the insulating film 16. The penetration parts 19 also have both end portions 19A and 19B projecting from the corresponding surfaces of the board 11 (specifically, the surfaces 16A and 16B, respectively, of the insulating film 16), and have the end portions 19B come into contact with the corresponding electrode pads 26 of the semiconductor chip 25 at the time of conducting an electrical test thereon. The support parts 21 are integrated with the end portions 19A of the corresponding penetration parts 19 and connected to the surface 16A of the insulating film 16 (the first surface of the board 11), and have a spring characteristic. As a result, even if the electrode pads 26 provided on the semiconductor chip 25 are arranged with a narrow pitch or in a matrix, it is possible to bring the probe needles 12 (specifically, the end portions 19B of the penetration parts 19) into contact with the corresponding electrode pads 26 with accuracy.

The pitch P for the probe needles 12 can be selected suitably within a range of, for example, 80 μm to 100 μm.

It is preferable to use, for example, Cu as the material of the probe needles 12 having the above-described configuration. Using Cu as the material of the probe needles 12 makes it possible to provide the support parts 21 with a spring characteristic and to facilitate formation of the probe needles 12 in the case of forming the probe needles 12 using a plating process.

Thus, according to the probe card 10 of this embodiment, the provision pitch P at which the probe needles 12 are provided (arranged) can be narrowed (reduced) by thus providing the probe card 10 with the probe needles 12 each having the penetration part 19 and the support part 21. The penetration parts 19 are placed in the corresponding through holes 18 without contacting the board body 15 and the insulating film 16. The penetration parts also have both end portions 19A and 19B projecting from the corresponding surfaces of the board 11 (specifically, the surfaces 16A and 16B, respectively, of the insulating film 16), and have the end portions 19B come into contact with the corresponding electrode pads 26 of the semiconductor chip 25 at the time of conducting an electrical test thereon. The support parts 21 are integrated with the end portions 19A of the corresponding penetration parts 19 and connected to the surface 16A of the insulating film 16 (the first surface of the board 11), and have a spring characteristic. As a result, even if the electrode pads 26 provided on the semiconductor chip 25 are arranged with a narrow pitch or in a matrix, it is possible to bring the probe needles 12 (specifically, the end portions 19B of the penetration parts 19) into contact with the corresponding electrode pads 26 with accuracy.

FIGS. 7A through 7M are diagrams illustrating a process for manufacturing a probe card according to the first embodiment of the present invention. In FIGS. 7A through 7M, the same elements as those of the probe card 10 of the first embodiment are referred to by the same reference numerals.

A description is given, with reference to FIGS. 7A through 7M, of a method of manufacturing the probe card 10 of the first embodiment. First, in the process illustrated in FIG. 7A, the plate-shaped board body 15 having the multiple through holes 18 is formed. Silicon, resin (such as insulating resin), or metal (such as Cu) may be used as the material of the board body 15. If the semiconductor substrate (not graphically illustrated) provided in the semiconductor chip 25 is a silicon substrate, it is preferable to use, for example, silicon as the material of the board body 15.

Using silicon as the material of the board body 15 reduces the difference in coefficient of thermal expansion between the probe card 10 and the semiconductor chip 25. As a result, it is possible to bring the probe needles 12 into contact with the corresponding electrode pads 26 provided on the semiconductor chip 25 with accuracy. In the case of using silicon as the material of the board body 15, the board body 15 can be, for example, 300 μm in thickness. Further, in the case of using silicon as the material of the board body 15, the through holes 18 can be formed by, for example, anisotropic etching (such as dry etching). In this case, the through holes 18 can be, for example, 50 μm in diameter. Further, the pitch for the through holes 18 can be, for example, 100 μm. In this embodiment, the following description is given, taking the case of using silicon as the material of the board body 15 as an example.

Next, in the process illustrated in FIG. 7B, the insulating film 16 is formed that covers the surface of the board body 15 illustrated in FIG. 7A (including a portion corresponding to the side surfaces of the through holes 18). As a result, the board 11 having the board body 15 and the insulating film 16 is formed. For example, an oxide film such as a thermal oxide film may be used as the insulating film 16. In the case of using a thermal oxide film as the insulating film 16, the thermal oxide film is formed to cover the surface of the board body 15 by, for example, subjecting the silicon board body 15 to thermal oxidation. In the case of using a thermal oxide film as the insulating film 16, the insulating film 16 can be, for example, 0.5 μm to 1.0 μm in thickness.

Next, in the process illustrated in FIG. 7C, a resist film 31 is formed in such a way to fill in the through holes 18 and to cover both surfaces 16A and 16B of the insulating film 16. The resist film 31 is formed by, for example, feeding liquid resist first to the surface 16A of the insulating film 16 and thereafter feeding the liquid resist to the surface 16B of the insulating film. A portion of the resist film 31 formed on each of the surfaces 16A and 16B of the insulating film 16 can be, for example, 20 μm in thickness.

Next, in the process illustrated in FIG. 7D, the resist film 31 provided on the structure illustrated in FIG. 7C is exposed to light through a mask, and the resist film 31 subjected to the exposure process is developed, so that openings 32 and openings 33 are formed in the resist film 31.

The openings 32 are formed in such a manner to penetrate through the resist film 31 filling in the through holes 18. The openings 32 are spaces where the penetration parts 19 of the probe needles 12 are to be formed. The openings 32 can be, for example, 30 μm in diameter. The openings 33 are formed in such a manner to expose portions of the surface 16A of the insulating film 16 corresponding to regions where the support parts 21 are to be formed. The openings 33 can be, for example, 30 μm in diameter.

Next, in the process illustrated in FIG. 7E, a metal plate 35 is stuck to the lower surface of the structure illustrated in FIG. 7D. The metal plate 35 is a member to serve as a feeding layer in forming the penetration parts of the probe needles 12 by electroplating. For example, a Cu plate may be used as the metal plate 35. In the process illustrated in FIG. 7E, metal foil may be stuck to the lower surface of the structure illustrated in FIG. 7D in place of the metal plate 35. For example, Cu foil may be used as the metal foil.

Next, in the process illustrated in FIG. 7F, the penetration parts 19 are formed by causing a plating film to be deposited and grow so as to fill in the openings 32 by electroplating using the metal plate 35 as a feeding layer. For example, a Cu plating film may be used as the plating film forming the penetration parts 19.

Next, in the process illustrated in FIG. 7G, the metal plate 35 provided on the structure illustrated in FIG. 7E is removed. Specifically, the metal plate 35 is stripped from the insulating film 16.

Next, in the process illustrated in FIG. 7H, a seed layer 37 is formed to cover an upper surface 31A (FIG. 7G) of the resist film 31, the surface of portions of the resist film 31 which portions correspond to the side surfaces of the openings 33, and the portions of the surface 16A of the insulating film 16 which portions are exposed in the openings 33. The seed layer 37 serves as a feeding layer in forming the support parts 21 of the probe needles 12 by electroplating. The seed layer 37 may be formed by a process such as sputtering or electroless plating. For example, a Cu layer may be used as the seed layer 37. In the case of using a Cu layer as the seed layer 37, the seed layer 37 can be, for example, 0.3 μm in thickness.

Figure 7I:
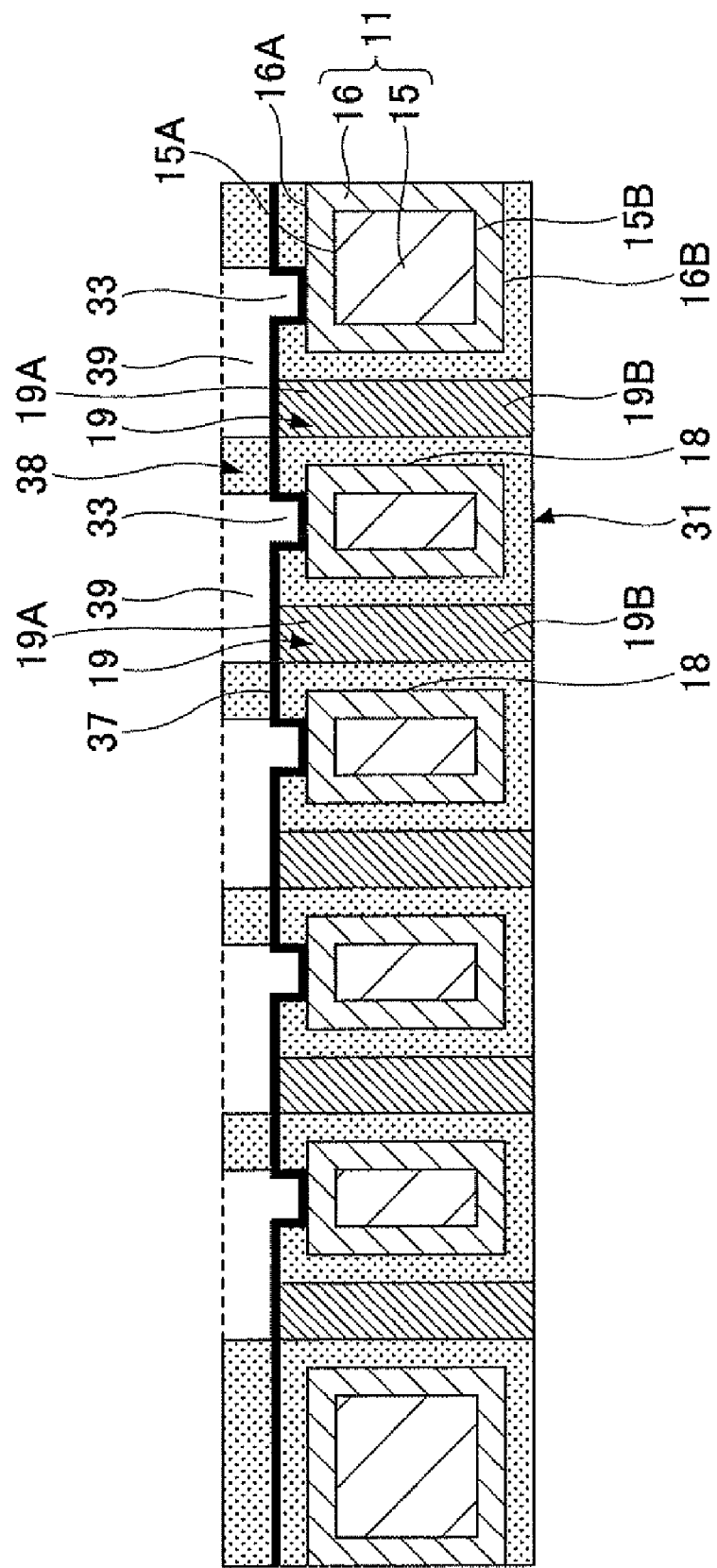

Next, in the process illustrated in FIG. 7I, a resist film 38 having openings 39 is formed on the seed layer 37. The openings 39 are formed in such a manner to expose portions of the seed layer 37 corresponding to the regions where the support parts 21 are to be formed.

Next, in the process illustrated in FIG. 7J, a plating film 41 is deposited to grow to fill in the openings 33 and 39 by electroplating using the seed layer 37 as a feeding layer. The plating film 41 is one of the components of the support parts 21. For example, a Cu plating film may be used as the plating film 41. In the case of using a Cu plating film as the plating film 41, the plating film 41 can have a thickness M of, for example, 10 μm.

Next, in the process illustrated in FIG. 7K, the resist film 38 formed on the seed layer 37 is removed. Then, in the process illustrated in FIG. 7L, unnecessary portions of the seed layer 37 which are not covered with the plating film 41, are removed. The unnecessary portions of the seed layer 37 are removed by, for example, etching. As a result, the probe needles 12 each having the penetration part 19 and the support part 21 composed of the seed layer 37 and the plating film 41 are formed.

Figure 7L:
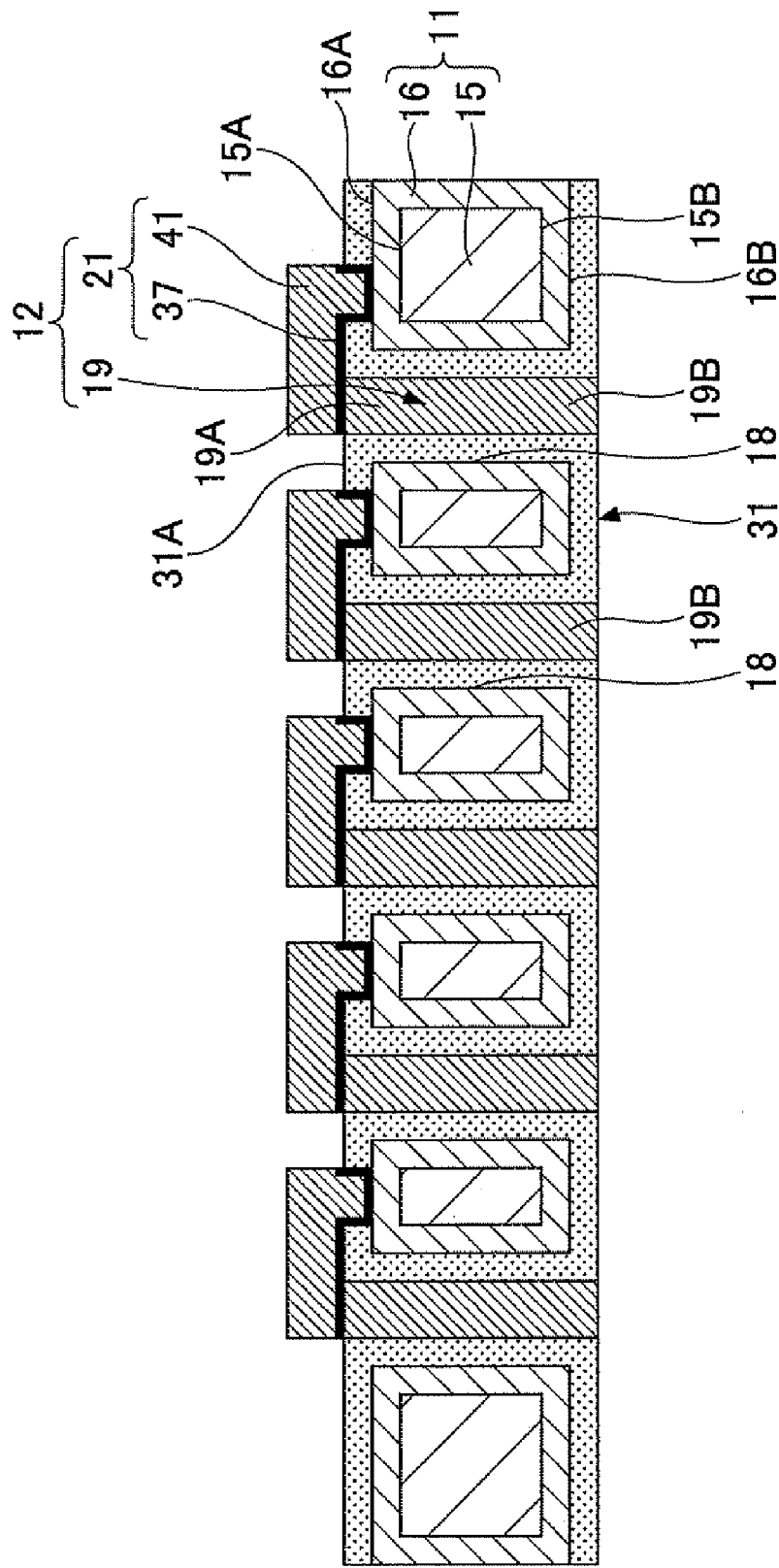
Figure 7M:
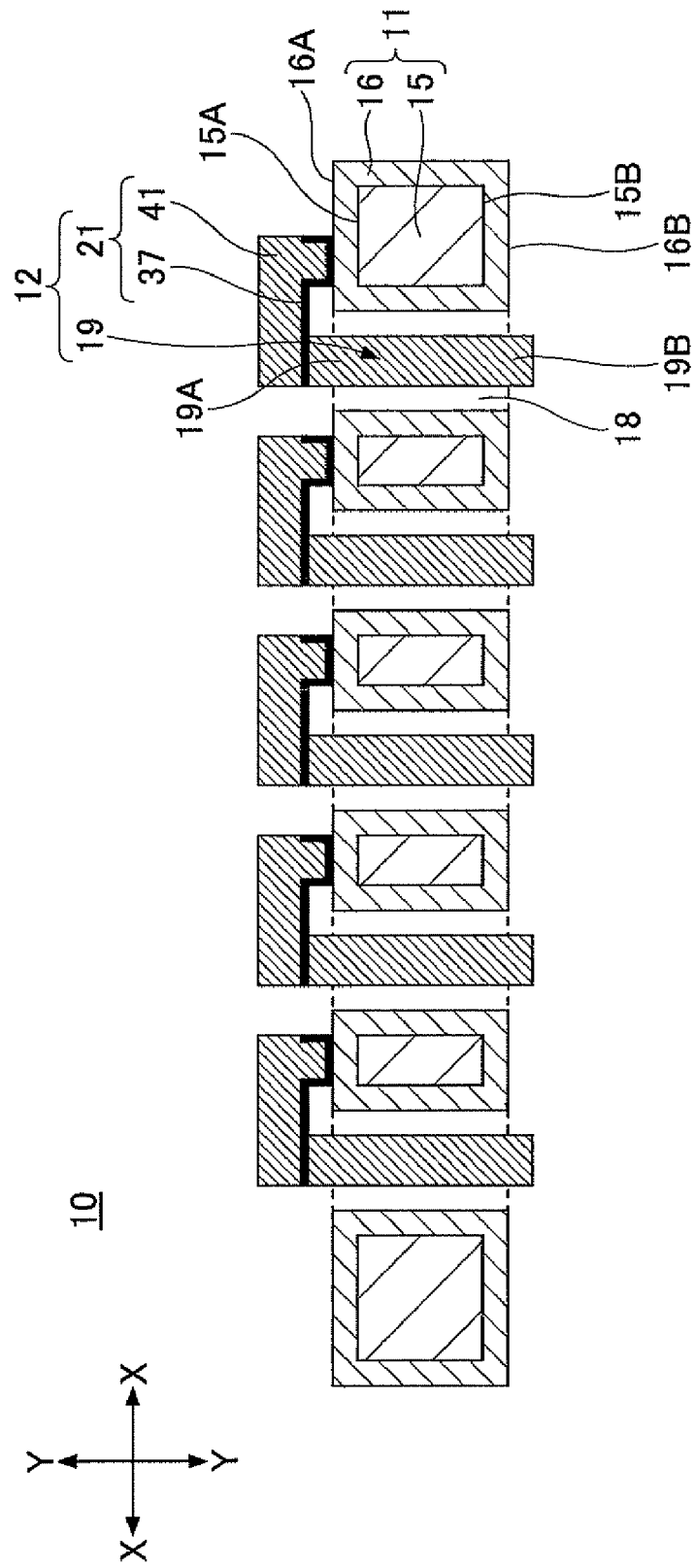

Next, in the process illustrated in FIG. 7M, the resist film 31 illustrated in FIG. 7L is removed. As a result, the probe card 10 of this embodiment is manufactured.

Second Embodiment

Figure 9:
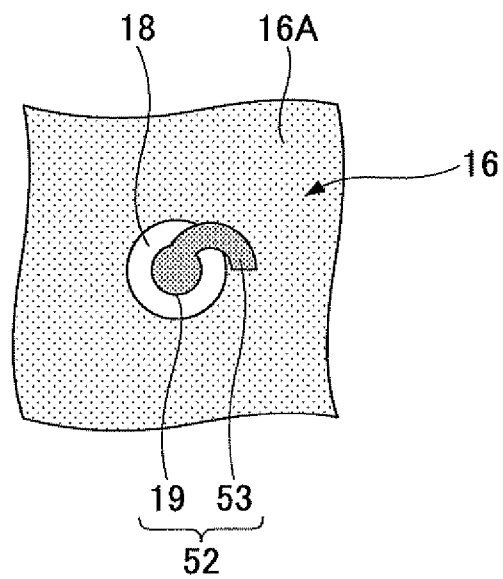
FIG. 9 is a plan view of one of probe needles illustrated in FIG. 8 according to the second embodiment of the present invention.

FIG. 8 is a cross-sectional view of a probe card according to a second embodiment of the present invention. FIG. 9 is a plan view of one of probe needles illustrated in FIG. 8. In FIG. 8 and FIG. 9, the same elements as those of the probe card 10 of the first embodiment are referred to by the same reference numerals.

Referring to FIG. 8 and FIG. 9, a probe card 50 of the second embodiment has the same configuration as the probe card 10 of the first embodiment except that the probe card 50 includes probe needles 52 in place of the probe needles 12 provided in the probe card 10.

The probe needles 52 have the same configuration as the probe needles 12 except that the probe needles 52 have spirally shaped support parts 53 (FIG. 9) in place of the support parts 21 provided in the probe needles 12. Each support part 53 has one end connected to the surface 16A of the insulating film 16 and has the other end integrated with the end portion 19A of the corresponding penetration part 19 into a unitary structure. The support part 53, which is formed of a conductive material such as Cu, has a spring characteristic.

According to the probe card 50 of this embodiment, the support parts 53, which are integrated with the corresponding penetration parts 19 that come into contact with the corresponding electrode pads 26 of the semiconductor chip 25, and are provided on the surface 16A of the insulating film 16, have a spiral shape. As a result, the support parts 53 have an improved spring characteristic. Further, the probe card 50 of this embodiment can produce the same effects as the probe card 10 of the first embodiment.

Further, the probe card 50 of the second embodiment can be manufactured in the same manner as the probe card 10 of the first embodiment.

Figure 10:
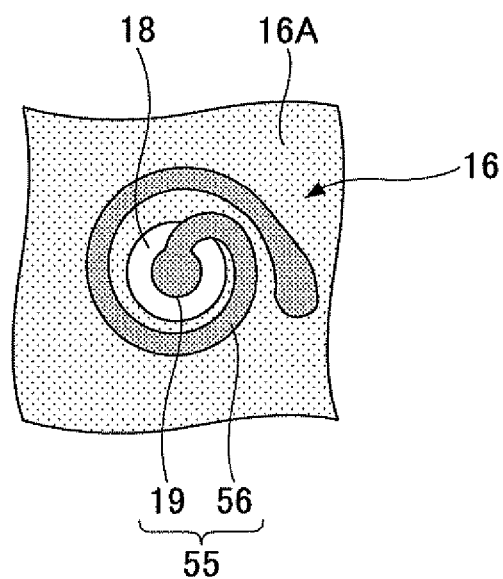
FIG. 10 is a plan view of part of another probe card according to the second embodiment of the present invention.

FIG. 10 is a plan view of part of another probe card 50A according to the second embodiment of the present invention. In FIG. 10, the same elements as those of the structure illustrated in FIG. 9 are referred to by the same reference numerals.

A support part 56 provided in a probe needle 55 illustrated in FIG. 10 has an increased spiral. As a result, the support part 56 can have a further improved spring characteristic.

Third Embodiment

Figure 11:
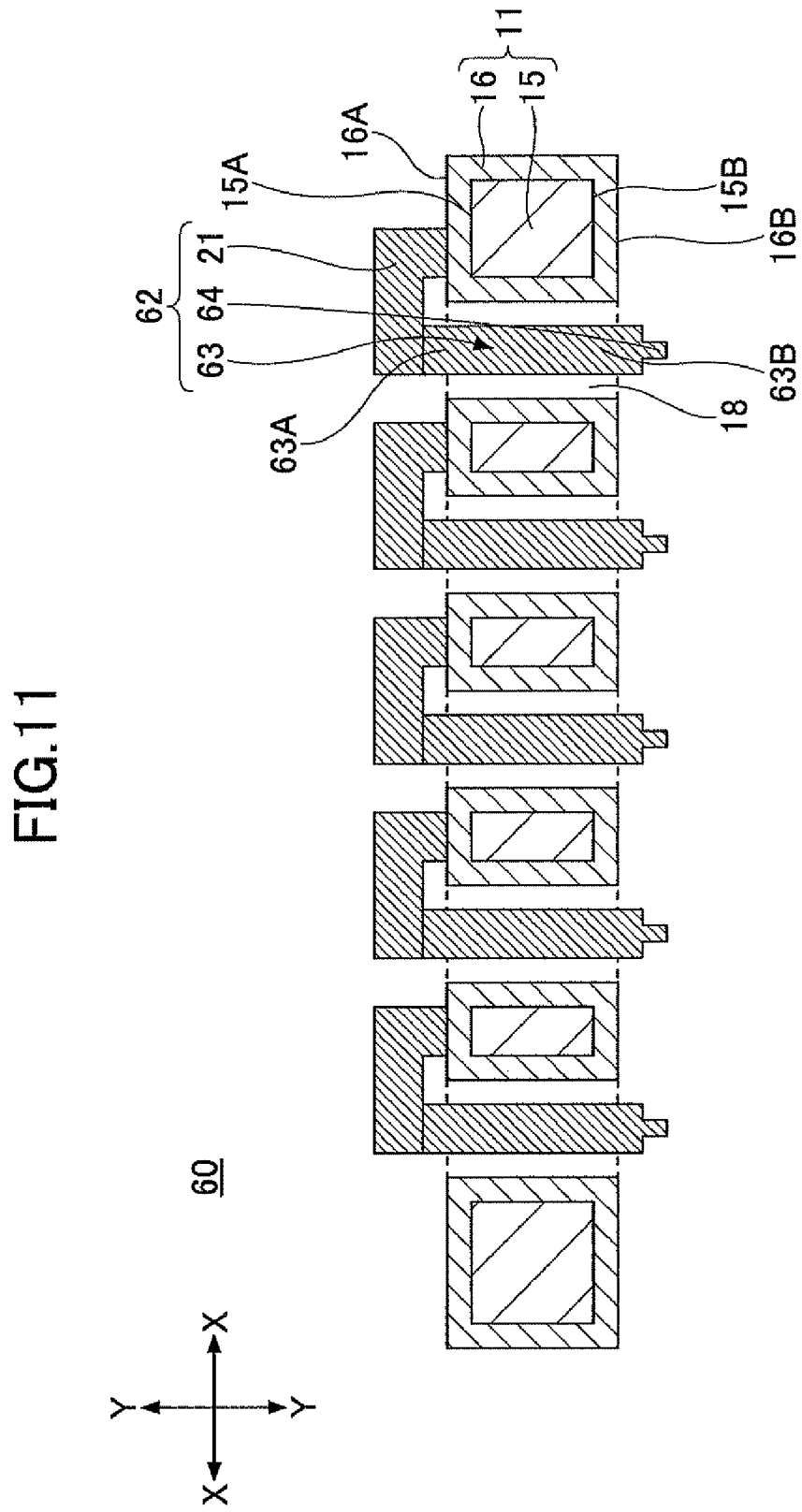
FIG. 11 is a cross-sectional view of a probe card according to a third embodiment of the present invention.

FIG. 11 is a cross-sectional view of a probe card according to a third embodiment of the present invention. In FIG. 11, the same elements as those of the probe card 10 of the first embodiment are referred by the same reference numerals.

Referring to FIG. 11, a probe card 60 of the third embodiment has the same configuration as the probe card 10 of the first embodiment except that the probe card 60 includes probe needles 62 in place of the probe needles 12 provided in the probe card 10.

The probe needles 62 have the same configuration as the probe needles 12 except that the probe needles 62 have penetration parts 63 in place of the penetration parts 19 provided in the probe needles 12. Each penetration part 63 has an end portion 63A integrated with the corresponding support part 21 into a unitary structure and has another end portion 63B provided with a projection part 64. The projection parts 64 come into contact with the corresponding electrode pads 26 of the semiconductor chip 25 at the time of conducting an electrical test on the semiconductor chip 25 with a prober (not graphically illustrated). The amount of projection of the projection parts 64 can be, for example, 25 μm. In this case, the projection parts 64 can be, for example, 30 μm in diameter.

According to the probe card 60 of this embodiment, the projection parts 64 are provided at the end portions 63B of the penetration parts 63 so as to come into contact with the corresponding electrode pads 26 provided on the semiconductor chip 25 at the time of conducting an electrical test on the semiconductor chip 25 with a prober. This allows the probe needles 62 (specifically, the end portions 63B of the penetration parts 63) to come into contact with the corresponding electrode pads 26 with accuracy. Further, the probe card 60 of this embodiment can produce the same effects as the probe card 10 of the first embodiment.

Figure 12:
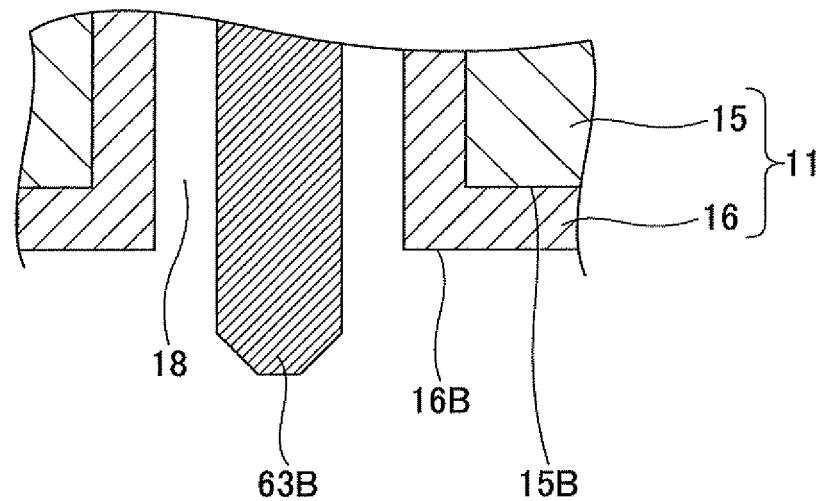
FIG. 12 is a diagram illustrating another shape of an end portion of a probe needle according to the third embodiment of the present invention.
Figure 13:
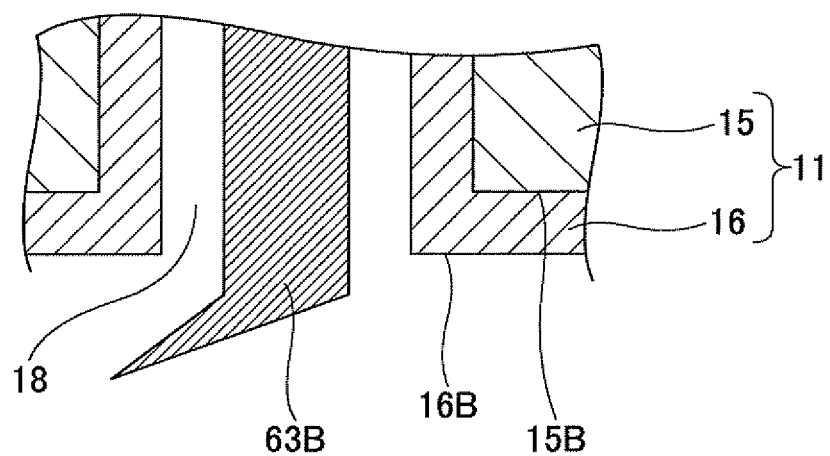
FIG. 13 is a diagram illustrating another shape of the end portion of the probe needle according to the third embodiment of the present invention.

FIG. 12 and FIG. 13 are diagrams illustrating other shapes of the end portions 63B of the penetration parts 63 of the probe needles 62 according to the third embodiment.

In the case illustrated in FIG. 11, the projection parts 64 are provided at the end portions 63B of the penetration parts 63. Alternatively, instead of providing the projection parts 64, the end portions 63B of the penetration parts 63 may be shaped as illustrated in, for example, FIG. 12 or FIG. 13. For example, the end portions 63B of the penetration parts 63 may be rounded or pointed.

FIGS. 14A through 14G are diagrams illustrating a process for manufacturing a probe card according to the third embodiment of the present invention. In FIGS. 14A through 14G, the same elements as those of the probe card 60 of the third embodiment are referred to by the same reference numerals.

A description is given, with reference to FIGS. 14A through 14G, of a method of manufacturing the probe card 60 of the third embodiment. First, the structure illustrated in FIG. 7D is formed in the same process as illustrated in FIGS. 7A through 7D in the first embodiment.

Figure 14A:
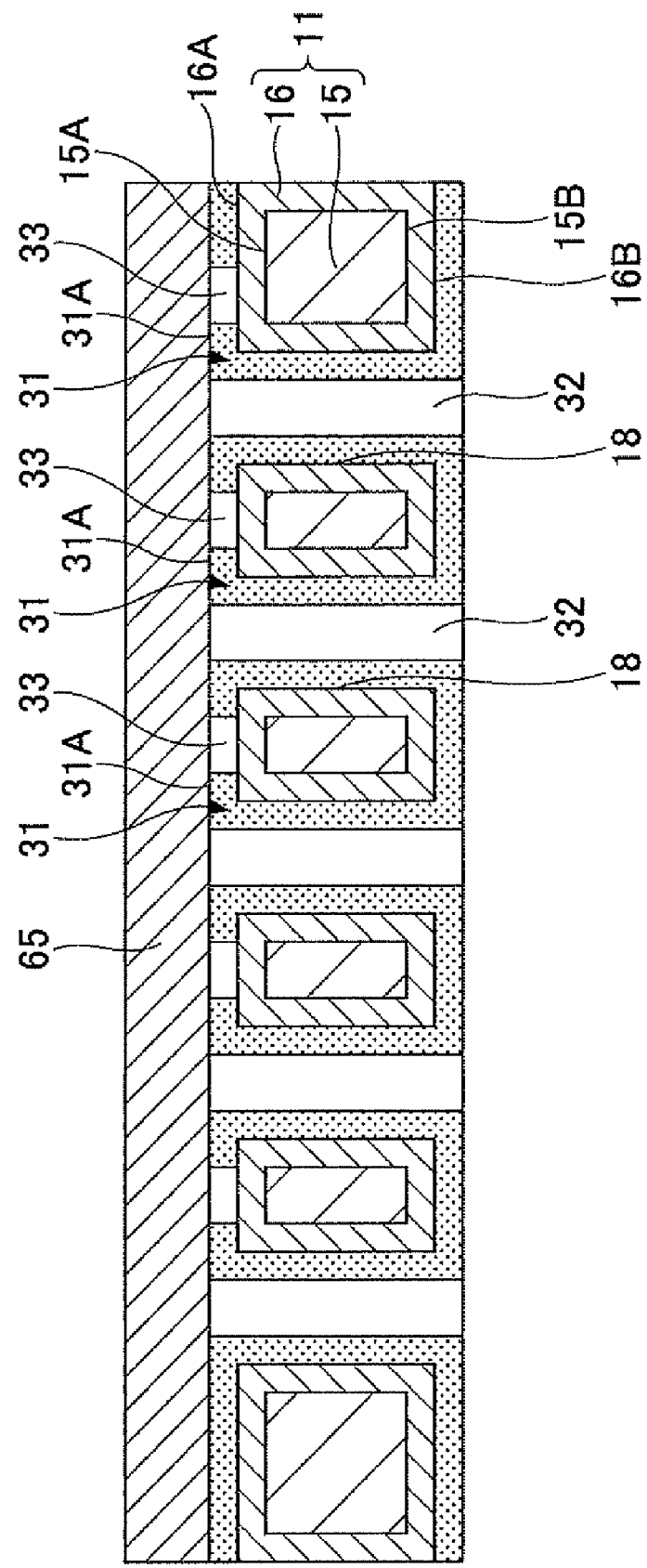

Next, in the process illustrated in FIG. 14A, a metal plate 65 is stuck to the upper surface of the structure illustrated in FIG. 7D. For example, a Cu plate may be used as the metal plate 65. Metal foil (such as Cu foil) may be used in place of the metal plate 65.

Next, in the process illustrated in FIG. 14B, the penetration parts 63 of the probe needles 62 are formed by causing a plating film (such as Cu foil) to be deposited to grow to fill in the openings 32 by electroplating using the metal plate 65 as a feeding layer.

Figure 14C:
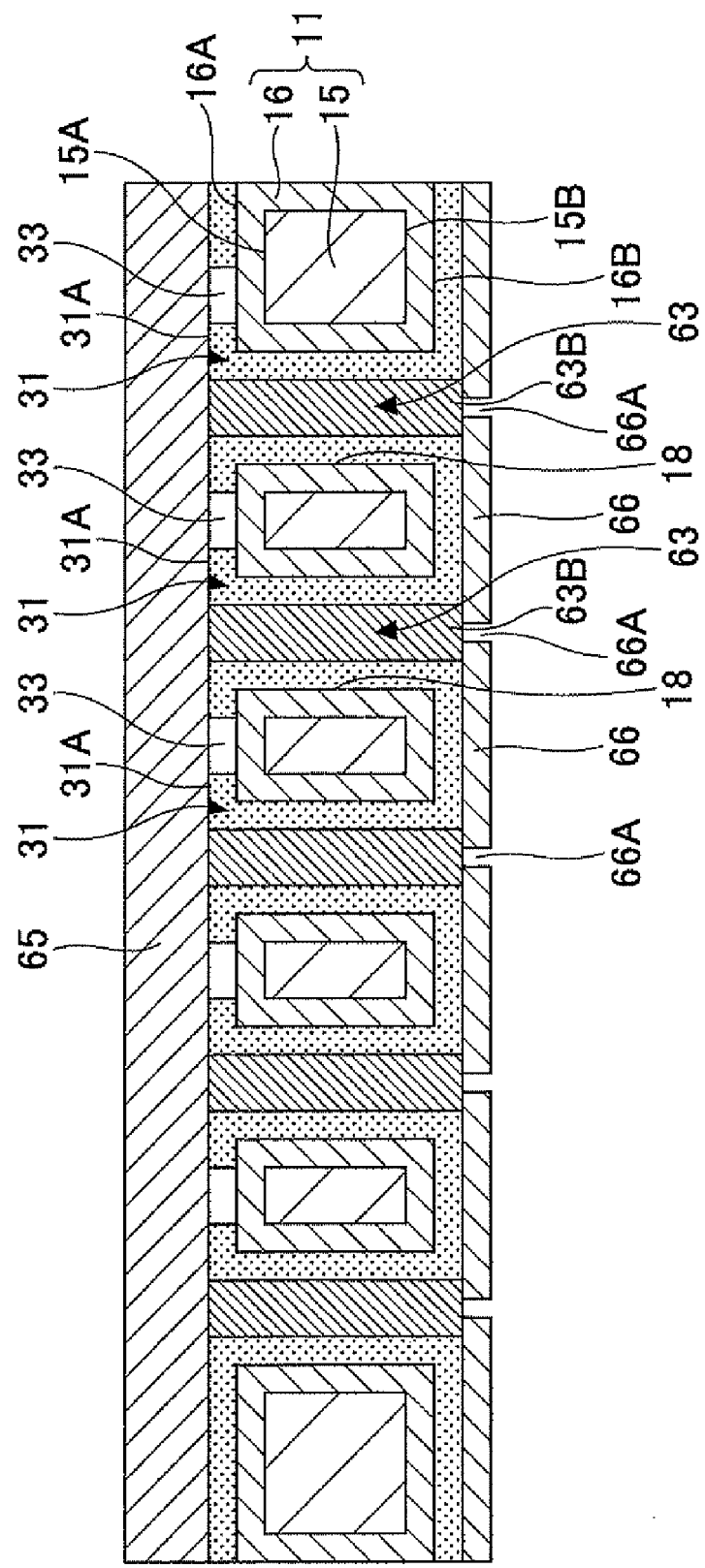

Next, in the process illustrated in FIG. 14C, a resist film 66 having openings 66A is formed on the lower surface of the structure illustrated in FIG. 14B. The openings 66A are formed in such a manner to expose the end portions 63B. The openings 66A have substantially the same shape as the projection parts 64. The openings 66A can be, for example, 30 μm in diameter. The resist film 66 can be, for example, 25 μm in thickness.

Figure 14D:
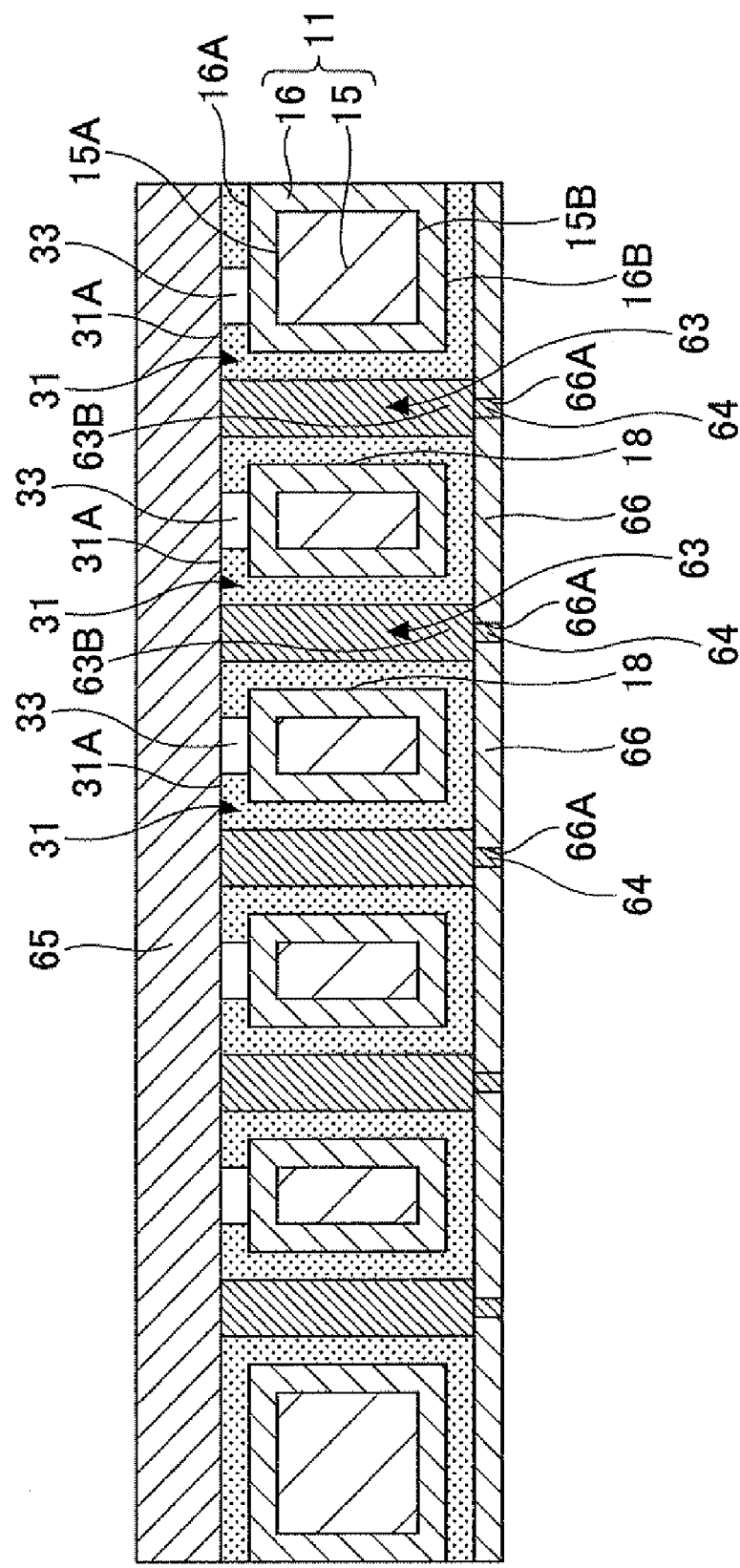
Figure 14F:
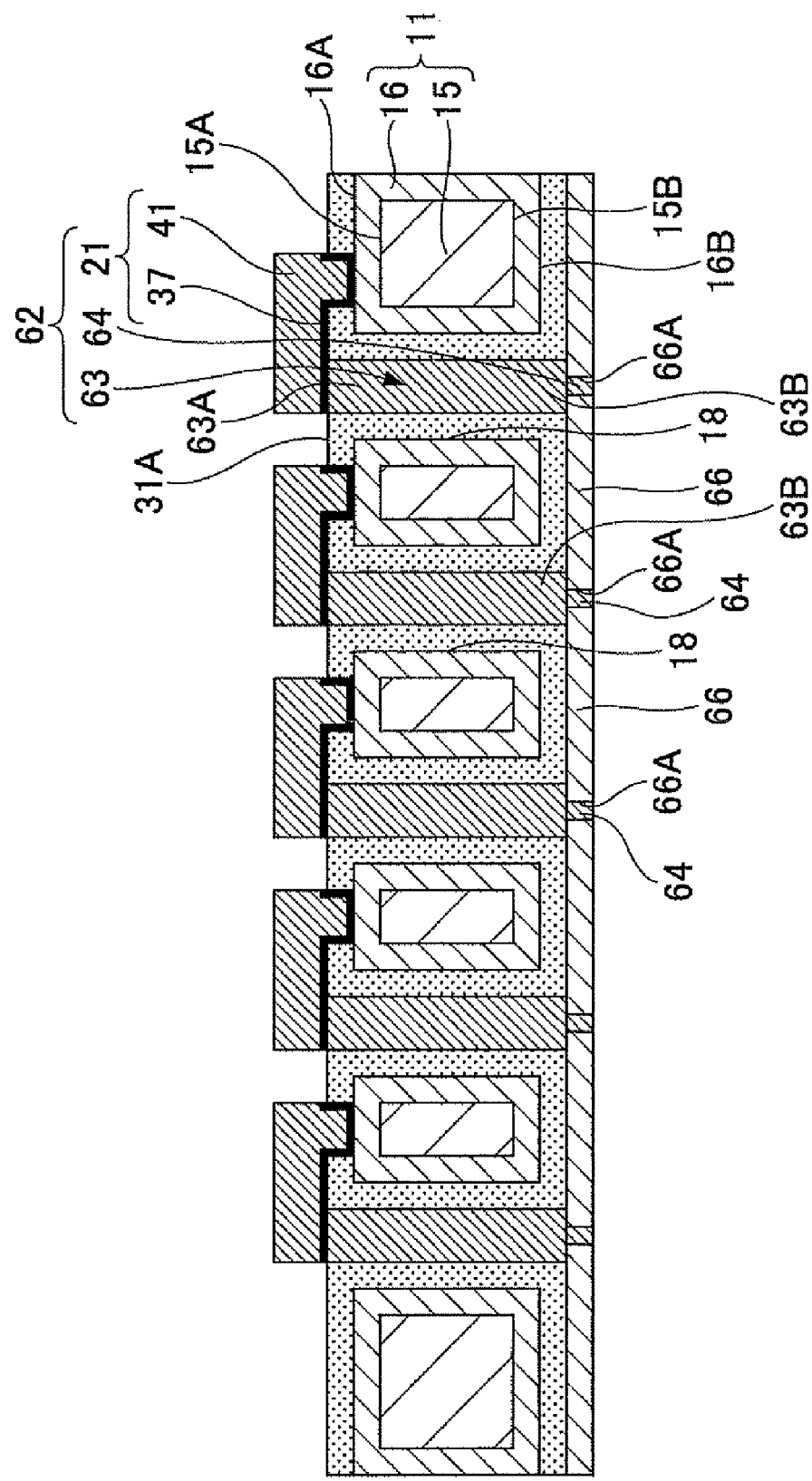

Next, in the process illustrated in FIG. 14D, the projection parts 64 of the probe needles 62 are formed by causing a plating film (such as Cu foil) to be deposited to grow to fill in the openings 66A by electroplating using the metal plate 65 as a feeding layer.

Next, in the process illustrated in FIG. 14E, the metal plate 65 is removed. Then, in the process illustrated in FIG. 14F, the support parts 21 are formed by performing the same processing as in the process illustrated in FIGS. 7H through 7L described in the first embodiment. As a result, the probe needles 62 are formed.

Next, in the process illustrated in FIG. 14G, the resist films 31 and 66 are removed. As a result, the probe card 60 illustrated in FIG. 11 is formed.

Fourth Embodiment

Figure 15:
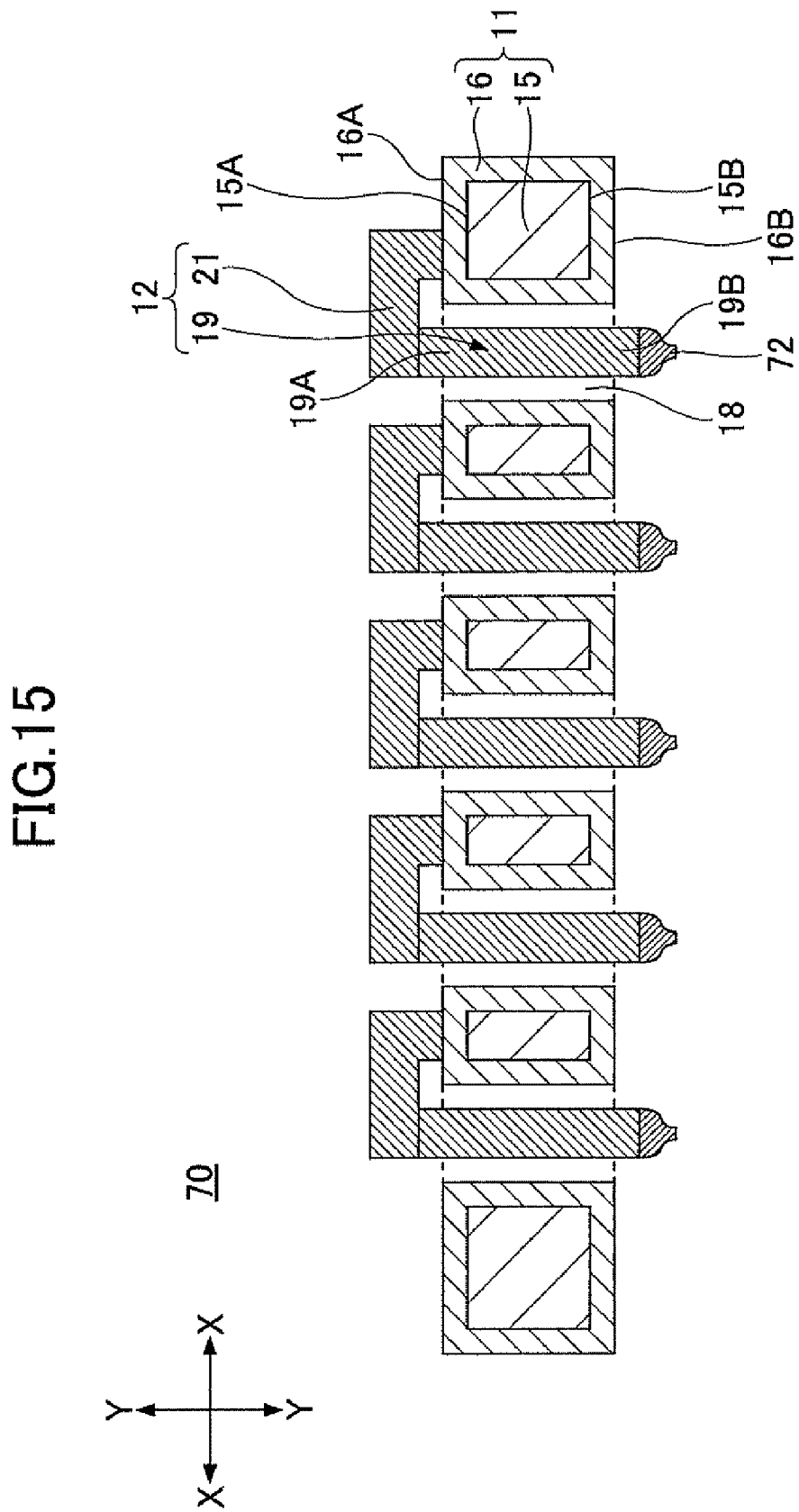
FIG. 15 is a cross-sectional view of a probe card according to a fourth embodiment of the present invention.

FIG. 15 is a cross-sectional view of a probe card according to a fourth embodiment of the present invention. In FIG. 15, the same elements as those of the probe card 10 of the first embodiment are referred to by the same reference numerals.

Referring to FIG. 15, a probe card 70 of the fourth embodiment has the same configuration as the probe card 10 of the first embodiment except that the probe card 70 further includes bumps 72 in addition to the configuration of the probe card 10.

The bumps 72 are provided at the end portions 19B of the penetration parts 19. The bumps 72 are members that come into contact with the corresponding electrode pads 26 provided on the semiconductor chip 25 at the time of conducting an electrical test on the semiconductor chip 25 with a prober (not graphically illustrated). For example, Au bumps may be used as the bumps 72. In the case of using Au bumps as the bumps 72, the bumps 72 may be, for example, 40 µm in height. In the case of using Au bumps as the bumps 72, the bumps 72 may be formed with, for example, a wire bonder.

According to the probe card 70 of this embodiment, the bumps 72 that come into contact with the electrode pads 26 of the semiconductor chip 25 are provided at the end portions 19B of the penetration parts 19. This allows the electrode pads 26 and the probe needles 12 to establish electrical connection with accuracy through the bumps 72 at the time of conducting an electrical test on the semiconductor chip 25 with a prober.

Further, the probe card 70 of this embodiment can produce the same effects as the probe card 10 of the first embodiment.

The embodiments of the present invention are applicable to probe cards having probe needles to come into contact with electrode pads at the time of conducting an electrical test on a semiconductor chip having the electrode pads.

The present invention is not limited to the specifically disclosed embodiments, and variations and modifications may be made without departing from the scope of the present invention.

The present application is based on Japanese Priority Patent Application No. 2008-130389, filed on May 19, 2008, the entire contents of which are incorporated herein by reference.

What is claimed is:

1. A probe card, comprising:
a board having a first surface and a second surface facing away from each other and a through hole formed between the first and second surfaces, the board including a board body having the through hole and an insulating film covering the board body; and
a probe needle having a penetration part and a support part, the penetration part being placed in the through hole without contacting the board and projecting from the first and second surfaces of the board, the support part having a first end portion and a second end portion, the first end portion being connected to and integrated with a first one of end portions of the penetration part over the through hole and the second end portion being connected to the insulating film on one of the first and second surfaces of the board so that the support part is supported on the insulating film at the second end portion in a cantilever manner, the support part having a spring characteristic,
wherein the penetration part is configured to have a second one of the end portions thereof come into contact with an electrode pad of a semiconductor chip at a time of conducting an electrical test on the semiconductor chip.

2. The probe card as claimed in claim 1, wherein a material of the board body is silicon.

3. The probe card as claimed in claim 1, wherein the support part has a spiral shape.

4. The probe card as claimed in claim 1, wherein a material of the probe needle is Cu.

5. The probe card as claimed in claim 1, wherein the second one of the end portions of the penetration part includes a bump to come into contact with the electrode pad.

6. The probe card as claimed in claim 1, wherein the second one of the end portions of the penetration part has one of a round shape and a pointed shape.

* * * * *